United States Patent
Ryu et al.

(10) Patent No.: US 12,473,309 B2
(45) Date of Patent: Nov. 18, 2025

(54) ORGANOMETALLIC COMPOUND AND METHOD OF MANUFACTURING INTEGRATED CIRCUIT USING THE SAME

(71) Applicant: SAMSUNG ELECTRONICS CO., LTD., Suwon-si (KR)

(72) Inventors: Seungmin Ryu, Hwaseong-si (KR); Younsoo Kim, Yongin-si (KR); Gyuhee Park, Hwaseong-si (KR); Younjoung Cho, Hwaseong-si (KR); Yutaro Aoki, Tokyo (JP); Wakana Fuse, Tokyo (JP); Kazuki Harano, Tokyo (JP); Takanori Koide, Tokyo (JP); Yoshiki Manabe, Tokyo (JP); Kazuya Saito, Tokyo (JP); Hiroyuki Uchiuzou, Tokyo (JP)

(73) Assignees: SAMSUNG ELECTRONICS CO., LTD.; ADEKA CORPORATION, Tokyo (JP)

( * ) Notice: Subject to any disclaimer, the term of this patent is extended or adjusted under 35 U.S.C. 154(b) by 1029 days.

(21) Appl. No.: 17/346,400

(22) Filed: Jun. 14, 2021

(65) Prior Publication Data

US 2021/0388010 A1 Dec. 16, 2021

(30) Foreign Application Priority Data

Jun. 16, 2020 (KR) .................. 10-2020-0073250
Feb. 17, 2021 (KR) .................. 10-2021-0021385

(51) Int. Cl.
| | | |
|---|---|---|
| *C07F 9/00* | (2006.01) | |
| *C23C 16/34* | (2006.01) | |
| *C23C 16/455* | (2006.01) | |
| *H10K 71/16* | (2023.01) | |
| *H10K 85/30* | (2023.01) | |

(52) U.S. Cl.
CPC .............. *C07F 9/005* (2013.01); *C23C 16/34* (2013.01); *C23C 16/45536* (2013.01); *C23C 16/45557* (2013.01); *H10K 71/166* (2023.02); *H10K 85/30* (2023.02)

(58) Field of Classification Search
CPC ........... C07F 9/005; C07F 17/00; C23C 16/34
See application file for complete search history.

(56) References Cited

U.S. PATENT DOCUMENTS

| | | | |
|---|---|---|---|
| 5,840,897 A | 11/1998 | Kirlin et al. | |
| 6,228,426 B1 | 5/2001 | Lee et al. | |
| 6,485,784 B1 | 11/2002 | Leedham et al. | |
| 7,514,115 B2 * | 4/2009 | Takashima | H10K 71/60 |
| | | | 313/506 |
| 7,619,093 B2 | 11/2009 | Meiere | |
| 8,460,989 B2 | 6/2013 | Blasco et al. | |
| 8,470,401 B2 | 6/2013 | Merle et al. | |
| 8,546,276 B2 | 10/2013 | Gatineau et al. | |
| 9,828,402 B2 | 11/2017 | Moon et al. | |
| 10,106,887 B2 | 10/2018 | Lansalot-Matras et al. | |
| 10,134,582 B2 | 11/2018 | Ryu et al. | |

FOREIGN PATENT DOCUMENTS

| | | |
|---|---|---|
| EP | 1916253 A1 | 4/2008 |
| JP | 1995-263442 A | 10/1995 |
| JP | 2000-117072 A | 4/2000 |
| JP | 2007-070236 A | 3/2007 |
| JP | 2010-507729 A | 3/2010 |
| KR | 10-0349001 B1 | 8/2002 |
| KR | 10-2009-0053423 A | 5/2009 |
| KR | 10-2012-0042971 A | 5/2012 |
| KR | 10-2013-0049020 A | 5/2013 |
| KR | 10-2016-0113473 A | 9/2016 |
| KR | 10-2017-0073947 A | 6/2017 |

OTHER PUBLICATIONS

V. Gibson, et al. 23 Dalton Transactions 4457-4465 (2003) (Year: 2003).*

Korean Notice of Allowance dated Feb. 14, 2023.

* cited by examiner

*Primary Examiner* — Alexander R Pagano
*Assistant Examiner* — Frank S. Hou
(74) *Attorney, Agent, or Firm* — Muir Patent Law, PLLC

(57) ABSTRACT

An organometallic compound and a method of manufacturing an integrated circuit (IC) device, the organometallic compound being represented by Formula (I),

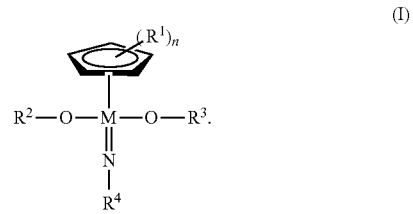

(I)

17 Claims, 16 Drawing Sheets

ORGANOMETALLIC COMPOUND AND METHOD OF MANUFACTURING INTEGRATED CIRCUIT USING THE SAME

CROSS-REFERENCE TO RELATED APPLICATION

Korean Patent Application Nos. 10-2020-0073250 and 10-2021-0021385, respectively filed on Jun. 16, 2020 and Feb. 17, 2021 in the Korean Intellectual Property Office, and both entitled: "Organometallic Compound and Method of Manufacturing Integrated Circuit Using the Same," are incorporated by reference herein in their entirety.

BACKGROUND

1. Field

Embodiments relate to an organometallic compound and a method of manufacturing an integrated circuit (IC) device using the same.

2. Description of the Related Art

In recent years, due to the development of electronic technology, the downscaling of semiconductor devices has rapidly progressed, and patterns included in electronic devices have been miniaturized.

SUMMARY

The embodiments may be realized by providing an organometallic compound represented by Formula (I),

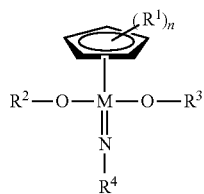

(I)

wherein, in Formula (I), M is a niobium atom, a tantalum atom, or a vanadium atom, $R^1$ is a C1-C5 straight-chain alkyl group or a C3-C5 branched alkyl group, $R^2$ and $R^3$ are each independently a C1-C8 straight-chain alkyl group or a C3-C8 branched alkyl group, at least one of $R^2$ and $R^3$ being substituted with at least one fluorine atom, $R^4$ is a C1-C10 straight-chain alkyl group or a C3-C10 branched alkyl group, and n is an integer of 0 to 5.

The embodiments may be realized by providing a method of manufacturing an integrated circuit (IC) device, the method including forming a metal-containing film on a substrate by using an organometallic compound represented by Formula (I):

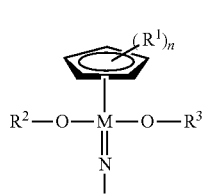

(I)

wherein, in Formula (I), M is a niobium atom, a tantalum atom, or a vanadium atom, $R^1$ is a C1-C5 straight-chain alkyl group or a C3-C5 branched alkyl group, $R^2$ and $R^3$ are each independently a C1-C8 straight-chain alkyl group or a C3-C8 branched alkyl group, at least one of $R^2$ and $R^3$ being substituted with at least one fluorine atom, $R^4$ is a C1-C10 straight-chain alkyl group or a C3-C10 branched alkyl group, and n is an integer of 0 to 5.

The embodiments may be realized by providing a method of manufacturing an integrated circuit (IC) device, the method including forming an insulating pattern on a first region of a substrate; forming a first metal-containing film on a second region of the substrate; and selectively forming a second metal-containing film only on the first metal-containing film, from among the insulating pattern and the first metal-containing film, by using an organometallic compound represented by Formula (I):

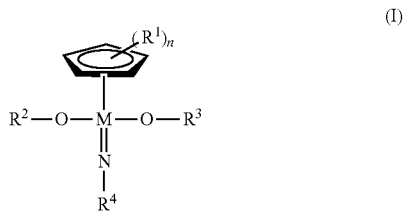

(I)

wherein, in Formula (I), M is a niobium atom, a tantalum atom, or a vanadium atom, $R^1$ is a C1-C5 straight-chain alkyl group or a C3-C5 branched alkyl group, $R^2$ and $R^3$ are each independently a C1-C8 straight-chain alkyl group or a C3-C8 branched alkyl group, at least one of $R^2$ and $R^3$ being substituted with at least one fluorine atom, $R^4$ is a C1-C10 straight-chain alkyl group or a C3-C10 branched alkyl group, and n is an integer of 0 to 5.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
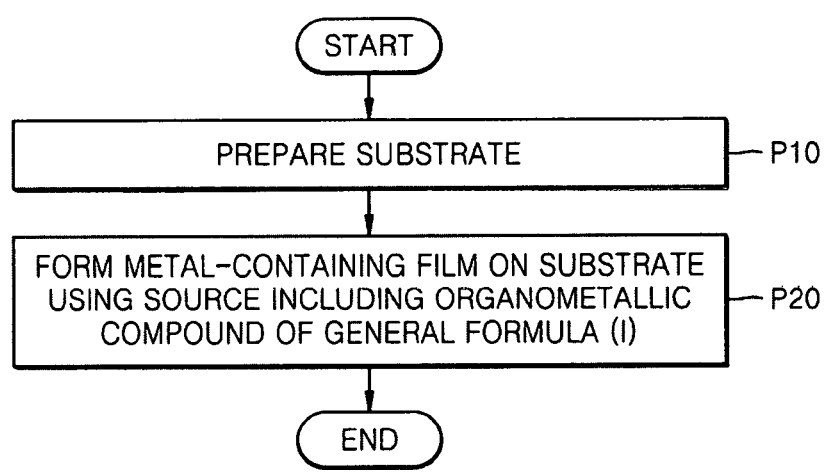
FIG. 1 is a flowchart of a method of manufacturing an integrated circuit (IC) device, according to embodiments.

When the term "substrate" is used herein, it should be understood as either the substrate itself or a stack structure including the substrate and a predetermined layer or film formed on a surface of the substrate. When the expression "a surface of a substrate" is used herein, it should be understood as either as an exposed surface of the substrate itself or an outer surface of a predetermined layer or film formed on the substrate. As used herein, the term "ambient temperature" refers to a temperature ranging from about 20° C. to about 28° C. and may vary depending on the season or other conditions.

As used herein, an abbreviation "Me" refers to a methyl group, an abbreviation "Et" refers to an ethyl group, an abbreviation "Pr" refers to a propyl group, an abbreviation "iPr" refers to an isopropyl group, an abbreviation "nBu" refers to a normal butyl group, an abbreviation "sBu" refers to a sec-butyl group (1-methylpropyl group), an abbreviation "tBu" refers to a tert-butyl group (1,1-dimethylethyl group), an abbreviation "iBu" refers to an isobutyl group (2-methylpropyl group), an abbreviation "tAm" refers to a tert-pentyl group (1,1-dimethylpropyl group), and an abbreviation "tOc" refers to a 1,1,3,3-tetramethylbutyl group. As used herein, the description of particular, groups, e.g., an alkyl group, refers to substituted or unsubstituted groups.

An organometallic compound according to an embodiment may include a cyclopentadienyl group and a transition metal selected from niobium, tantalum, and vanadium.

The organometallic compound according to an embodiment may be represented by the following Formula (I):

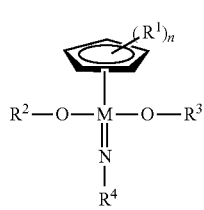

(I)

In Formula (I), M may be, e.g., a niobium atom, a tantalum atom, or a vanadium atom. As used herein, the term "or" is not an exclusive term, e.g., "A or B" would include A, B, or A and B.

$R^1$ may be or may include, e.g., a C1-C5 straight-chain alkyl group or a C3-C5 branched alkyl group.

$R^2$ and $R^3$ may each independently be or include, e.g., a C1-C8 straight-chain alkyl group or a C3-C8 branched alkyl group. In an implementation, and at least one of $R^2$ and $R^3$ may have at least one fluorine atom substituted for a hydrogen atom (e.g., at least one of $R^2$ and $R^3$ may be substituted with at least one fluorine atom).

$R^4$ may be or may include, e.g., a C1-C10 straight-chain alkyl group or a C3-C10 branched alkyl group.

n may be an integer of 0 to 5.

In an implementation, $R^1$ may be a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a neopentyl group, or a 3-pentyl group. In an implementation, $R^1$ may be methyl group or an ethyl group.

In an implementation, $R^2$ and $R^3$ may each independently be a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a neopentyl group, a 3-pentyl group, an n-hexyl group, an n-heptyl group, or an n-octyl group.

In an implementation, $R^2$ and $R^3$ may each independently be a fluoroalkyl group in which some or all of hydrogen atoms of the alkyl group are substituted with fluorine atoms. In an implementation, $R^2$ and $R^3$ may each independently be a C1-C8 straight-chain perfluoroalkyl group or a C3-C5 branched perfluoroalkyl group in which all of the hydrogen atoms included in the alkyl group are substituted with fluorine atoms. In an implementation, at least one of $R^2$ and $R^3$ may be a C3-C5 branched perfluoroalkyl group. In an implementation, $R^2$ and $R^3$ may each independently be a hexafluoroisopropyl group or a nonafluoro tert-butyl group.

In an implementation, $R^4$ may be a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a neopentyl group, a 3-pentyl group, an n-hexyl group, an n-heptyl group, an n-octyl group, a tert-octyl group, an n-nonyl group, or an n-decyl group. In an implementation, $R^4$ may be a C3-C8 branched alkyl group. When $R^4$ is the C3-C8 branched alkyl group, the thermal stability of the organometallic compound of Formula (I) may be further improved.

In an implementation, as n is reduced, a melting point of the organometallic compound of Formula (I) may be lowered. In an implementation, n may be 0 or 1.

In an implementation, at least one of $R^2$, $R^3$, and $R^4$ may be a C3-C8 branched alkyl group. In an implementation, $R^2$, $R^3$, and $R^4$ may each independently be a C3-C8 branched alkyl group.

In an implementation, in Formula (I), when M is a niobium atom and n is 0, $R^2$ and $R^3$ may each independently be a hexafluoroisopropyl group or a nonafluoro tert-butyl group.

The organometallic compound according to the embodiments may be a liquid at room or ambient temperature (e.g., and under ambient or atmospheric pressure). When an organometallic compound is a liquid at ambient temperature, the organometallic compound may be easily handled. In Formula (I), when at least one of $R^2$, $R^3$, and $R^4$ is a branched alkyl group, the organometallic compound may be advantageously put into a liquid phase at ambient temperature.

In an implementation, M may be a niobium atom in Formula (I), and Formula (I) may be represented by Formula (1A).

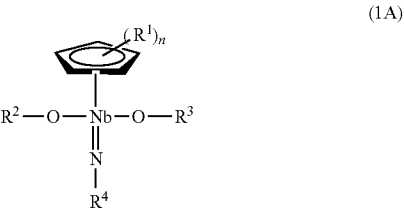

(1A)

In an implementation, M may be a tantalum atom in Formula (I), and Formula (I) may be represented by Formula (1).

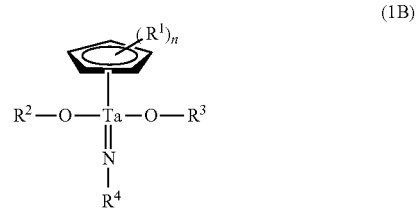

(1B)

In an implementation, M may be a vanadium atom in Formula (I), and Formula (I) may be represented by Formula (1C).

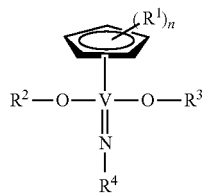
(1C)

In the organometallic compound represented by Formula (I), each of $R^1$ to $R^4$ may contribute toward increasing a vapor pressure of the organometallic compound, reducing a melting point of the organometallic compound, and improving the stability of the organometallic compound during a thin film manufacturing process including a process of vaporizing the organometallic compound.

In an implementation, in the organometallic compound of Formula (I), when n is an integer of 0 to 2 and at least one of $R^2$, $R^3$, and $R^4$ is a branched alkyl group, a melting point of the organometallic compound of Formula (I) may be lowered.

In an implementation, when $R^1$ is a C1 to C3 alkyl group in the organometallic compound of Formula (I), a vapor pressure of the organometallic compound may be increased. When n is an integer of 1 to 5 in Formula (I), $R^1$ may be a methyl group or an ethyl group.

In an implementation, in the organometallic compound of Formula (I), when at least one of $R^2$ and $R^3$ is a C3-C6 branched alkyl group and some or all of hydrogen atoms of the alkyl group are substituted with fluorine atoms, the thermal stability of the organometallic compound may be improved. In an implementation, at least one of $R^2$ and $R^3$ may be a hexafluoroisopropyl group or a nonafluoro tert-butyl group.

In an implementation, when $R^4$ includes a C3-C8 branched alkyl group in the organometallic compound of Formula (I), the thermal stability of the organometallic compound may be improved. In an implementation, $R^4$ may be a tert-butyl group, a tert-pentyl group, or a tert-octyl group.

When a thin film is formed using a metal organic deposition (MOD) process, which does not involve a vaporization process, by using the organometallic compound of Formula (I), each of M, n, and $R^1$ to $R^4$ in Formula (I) may be selected considering solubility in a used solvent, a thin-film forming reaction, or the like.

Specific examples of the organometallic compound according to the embodiments may be represented by the following Formulae 1 to 210.

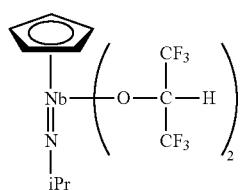
Formula 1

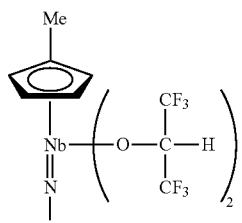
Formula 2

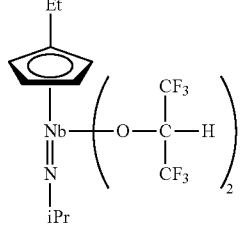
Formula 3

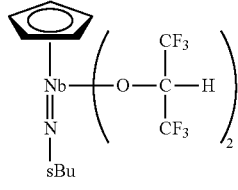
Formula 4

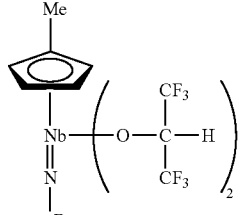
Formula 5

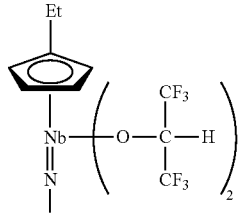
Formula 6

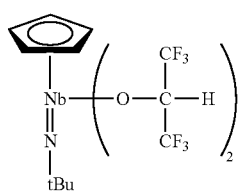
Formula 7

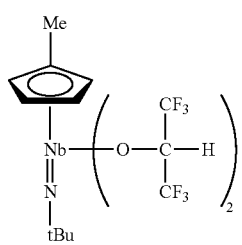
Formula 8

Formula 9
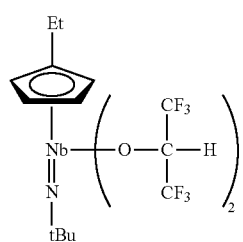
Formula 10
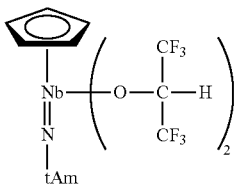
Formula 11
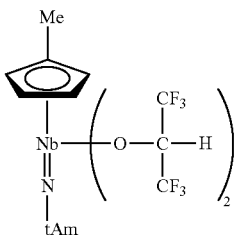
Formula 12
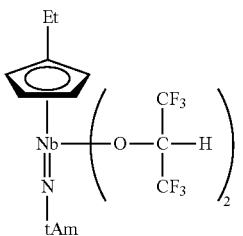
Formula 13
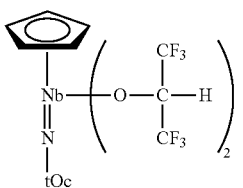
Formula 14
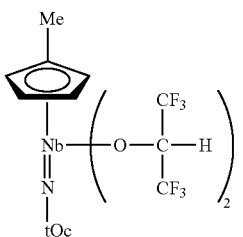
Formula 15
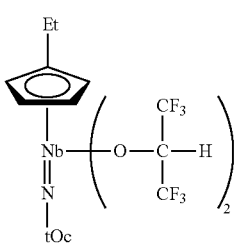
Formula 16
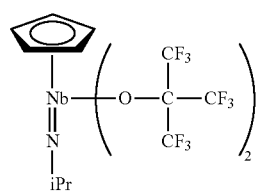
Formula 17
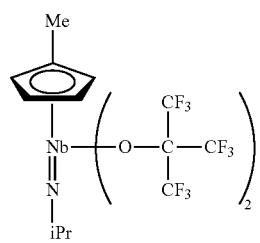
Formula 18
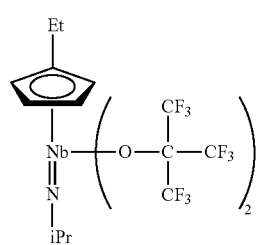
Formula 19
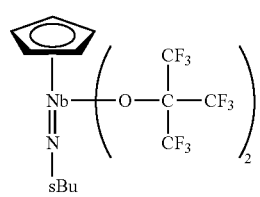
Formula 20
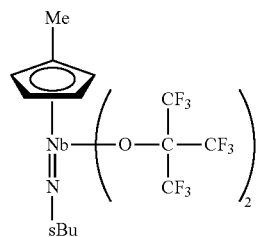
Formula 21
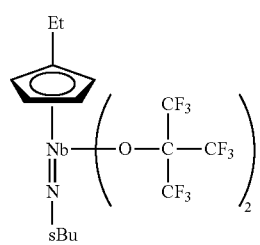
Formula 22
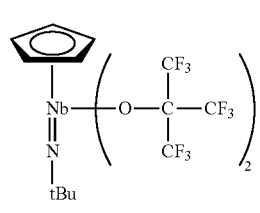

Formula 23
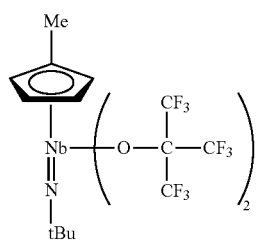
Formula 24
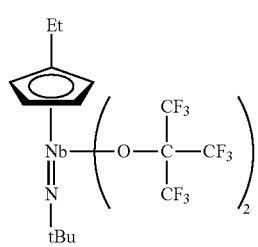
Formula 25
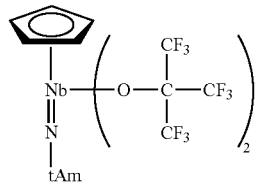
Formula 26
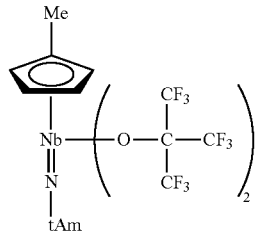
Formula 27
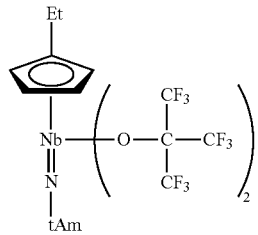
Formula 28
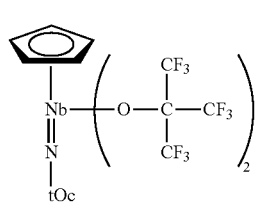
Formula 29
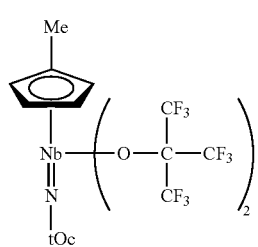
Formula 30
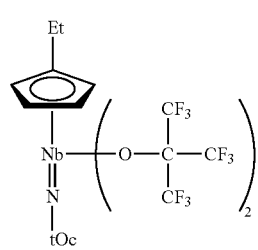
Formula 31
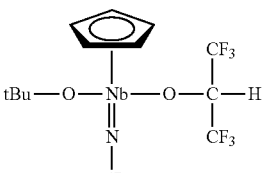
Formula 32
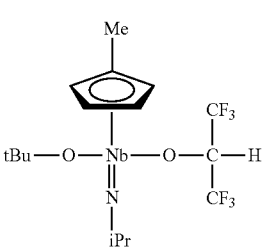
Formula 33
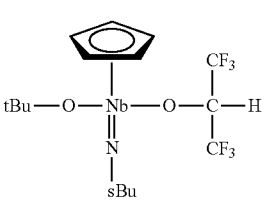
Formula 34
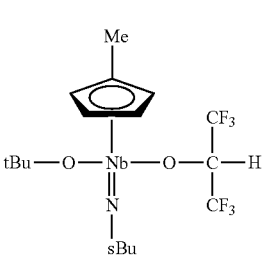
Formula 35
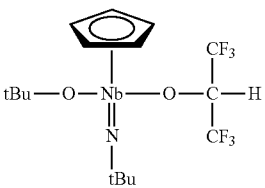
Formula 36
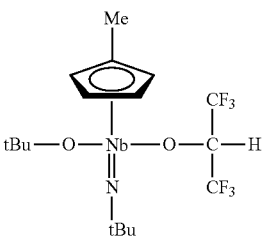

-continued
Formula 37
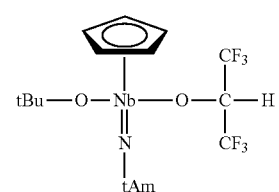
Formula 38
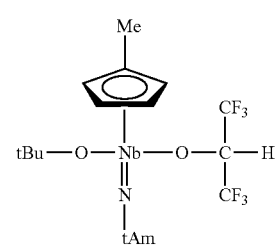
Formula 39
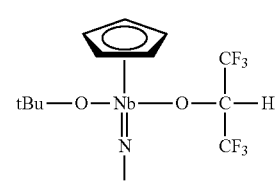
Formula 40
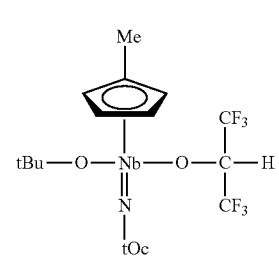
Formula 41
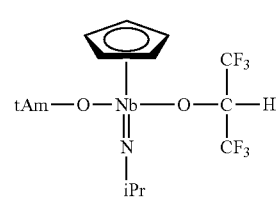
Formula 42
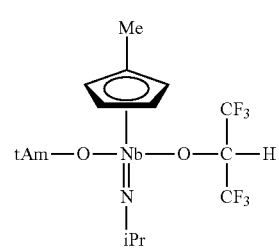
Formula 43
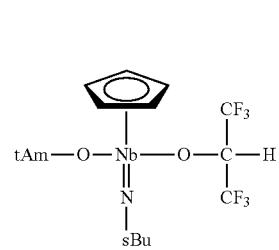
-continued
Formula 44
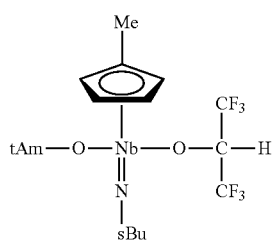
Formula 45
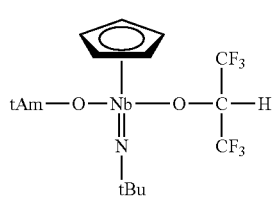
Formula 46
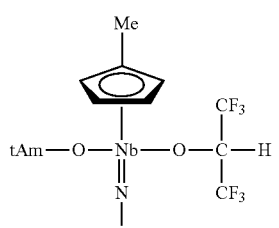
Formula 47
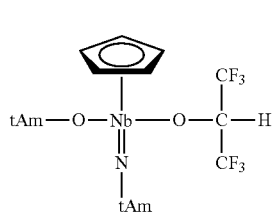
Formula 48
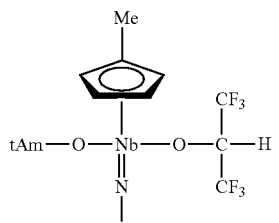
Formula 49
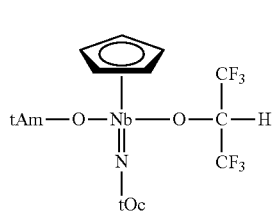
Formula 50
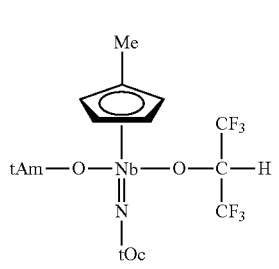

Formula 51
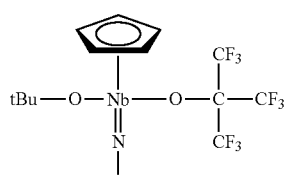
Formula 52
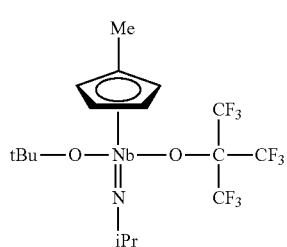
Formula 53
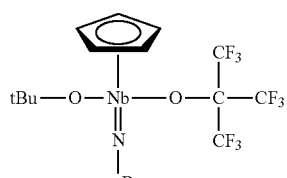
Formula 54
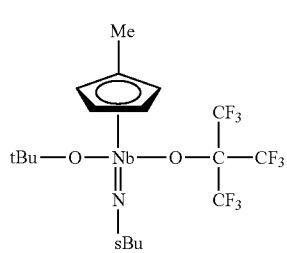
Formula 55
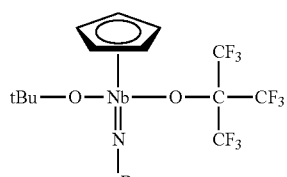
Formula 56
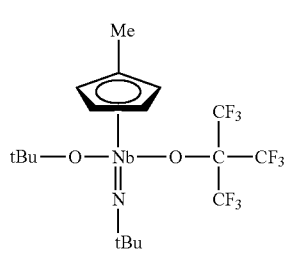
Formula 57
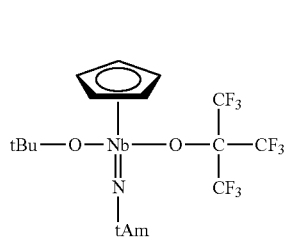
Formula 58
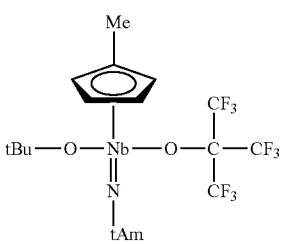
Formula 59
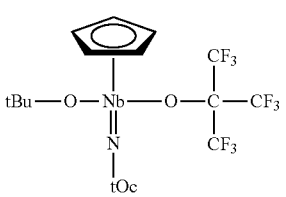
Formula 60
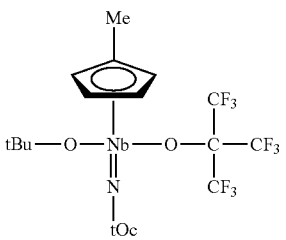
Formula 61
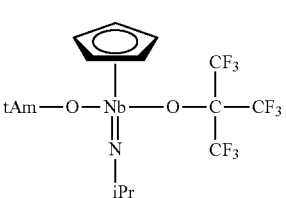
Formula 62
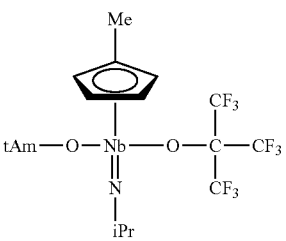
Formula 63
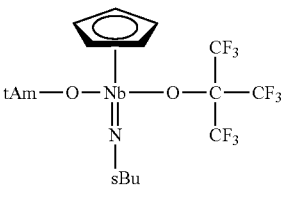
Formula 64
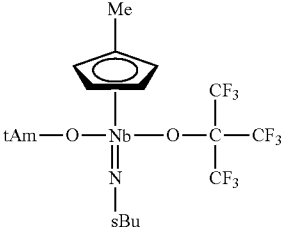

Formula 65
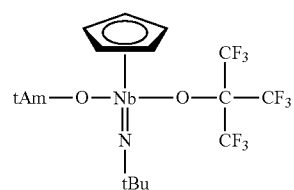
Formula 66
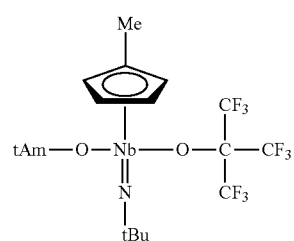
Formula 67
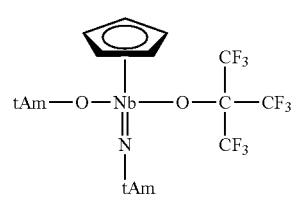
Formula 68
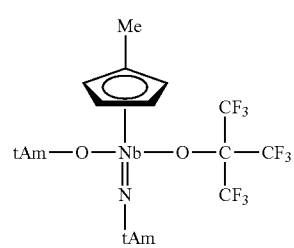
Formula 69
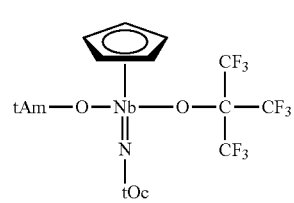
Formula 70
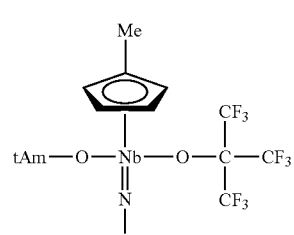
Formula 71
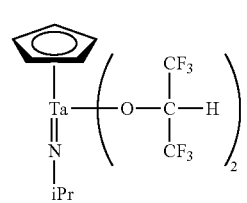
Formula 72
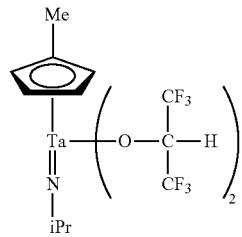
Formula 73
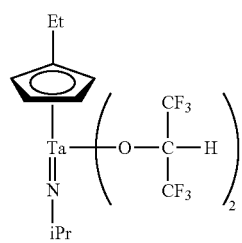
Formula 74
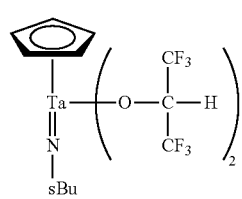
Formula 75
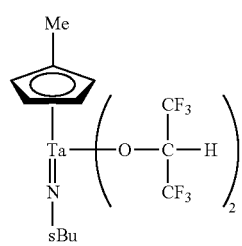
Formula 76
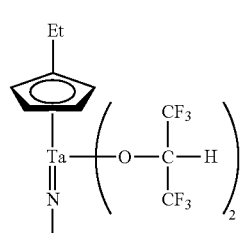
Formula 77
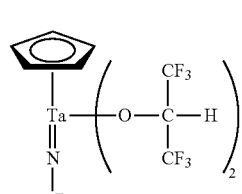
Formula 78
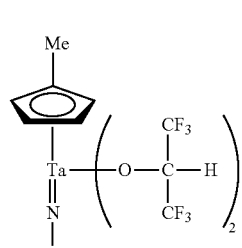

-continued
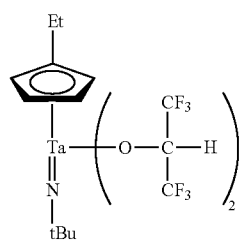
Formula 79
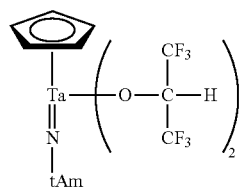
Formula 80
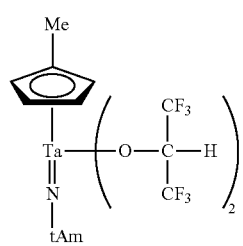
Formula 81
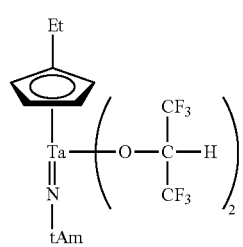
Formula 82
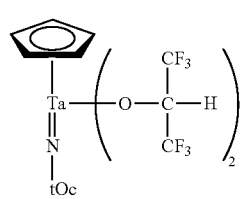
Formula 83
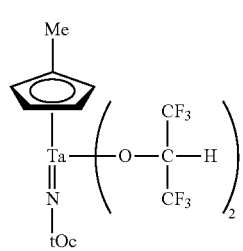
Formula 84
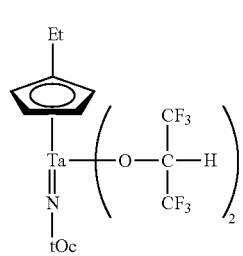
Formula 85
-continued
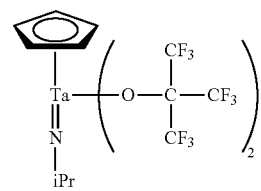
Formula 86
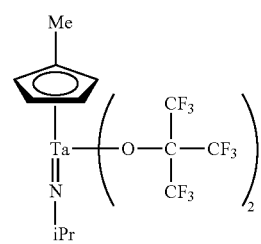
Formula 87
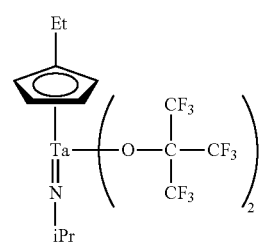
Formula 88
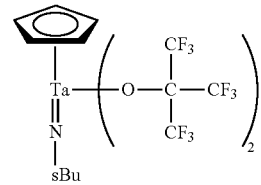
Formula 89
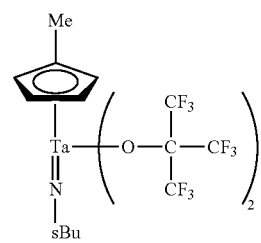
Formula 90
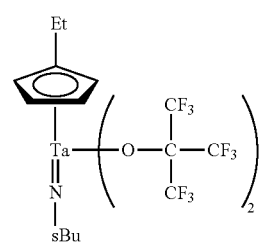
Formula 91
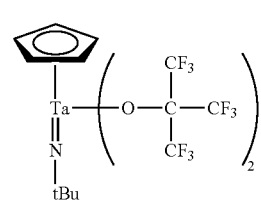
Formula 92

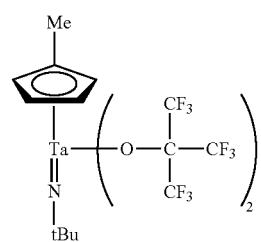
Formula 93
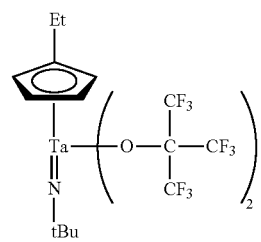
Formula 94
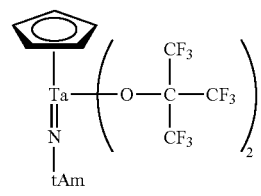
Formula 95
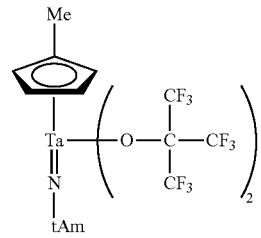
Formula 96
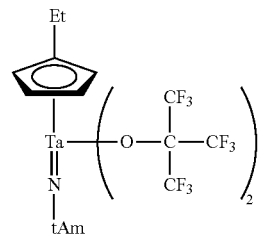
Formula 97
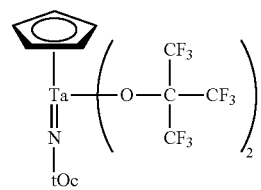
Formula 98
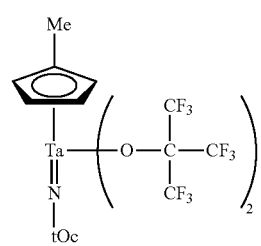
Formula 99
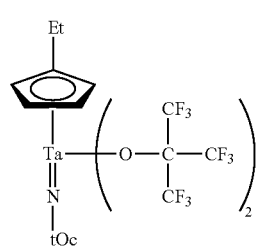
Formula 100
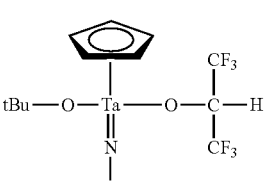
Formula 101
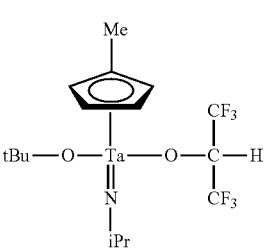
Formula 102
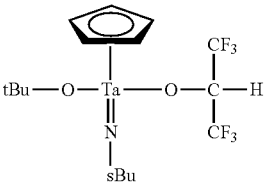
Formula 103
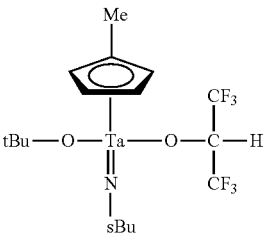
Formula 104
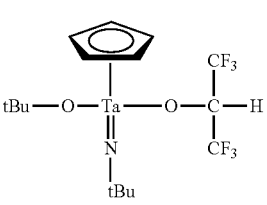
Formula 105
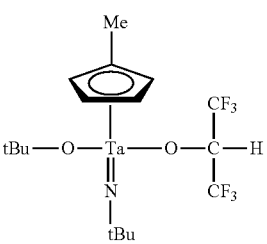
Formula 106

-continued
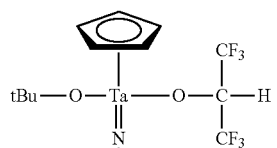
Formula 107
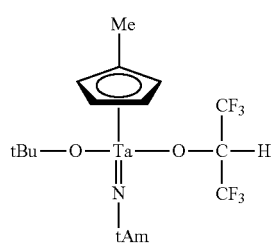
Formula 108
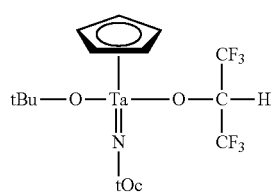
Formula 109
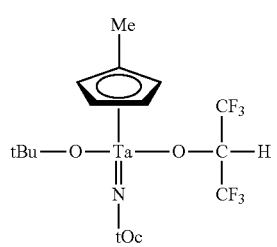
Formula 110
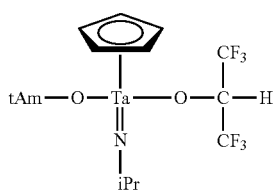
Formula 111
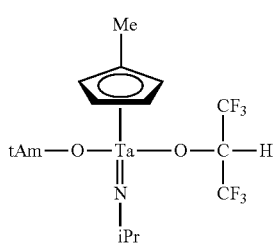
Formula 112
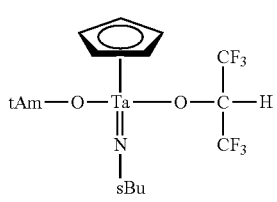
Formula 113
-continued
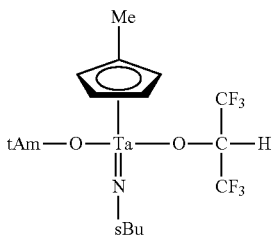
Formula 114
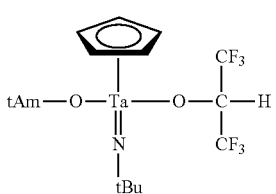
Formula 115
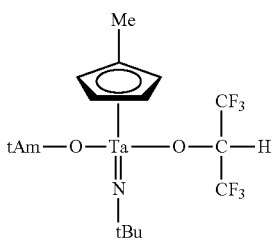
Formula 116
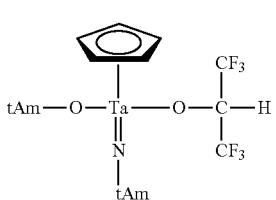
Formula 117
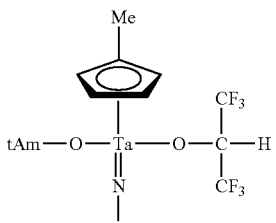
Formula 118
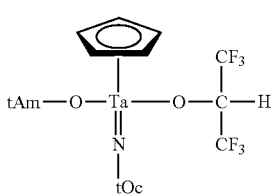
Formula 119
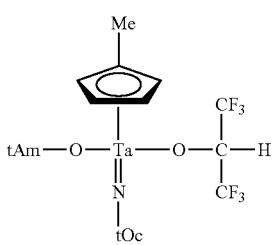
Formula 120

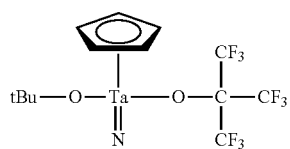
Formula 121
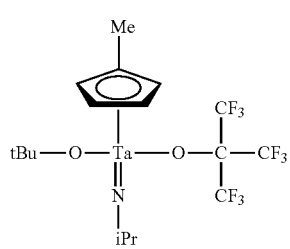
Formula 122
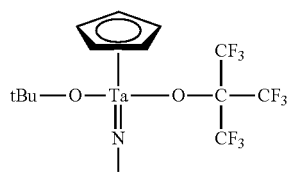
Formula 123
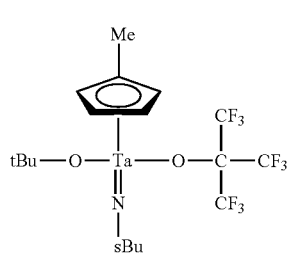
Formula 124
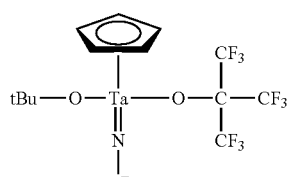
Formula 125
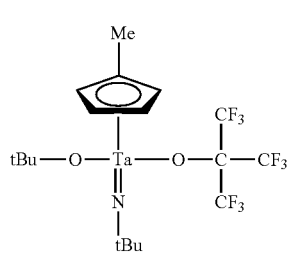
Formula 126
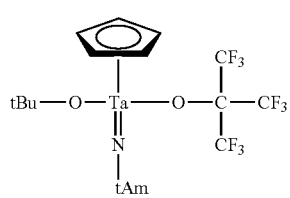
Formula 127
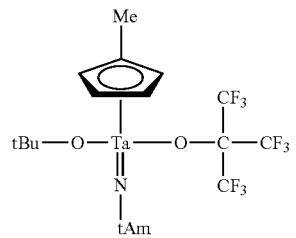
Formula 128
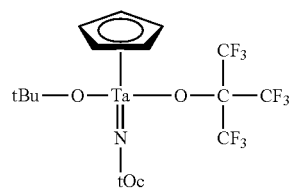
Formula 129
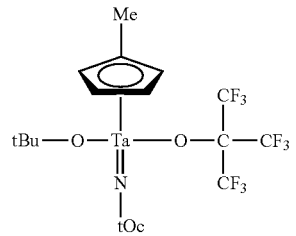
Formula 130
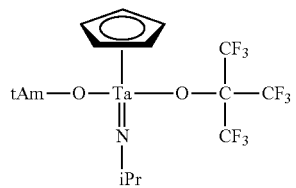
Formula 131
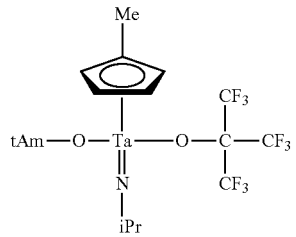
Formula 132
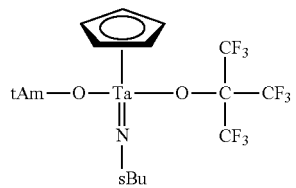
Formula 133
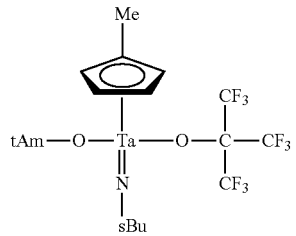
Formula 134

-continued
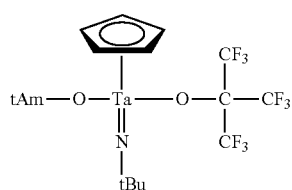
Formula 135
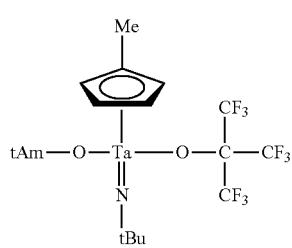
Formula 136
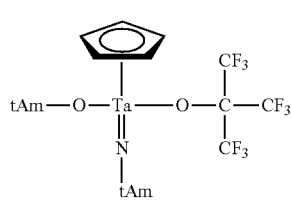
Formula 137
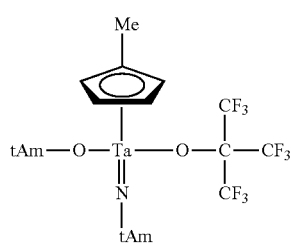
Formula 138
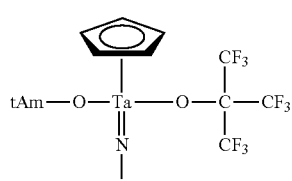
Formula 139
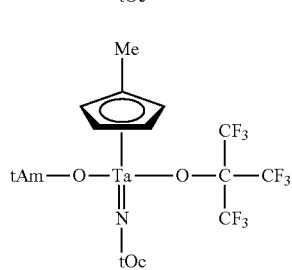
Formula 140
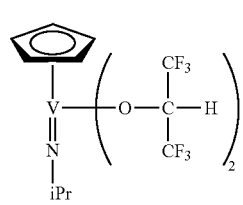
Formula 141
-continued
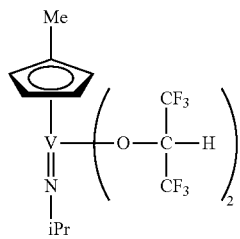
Formula 142
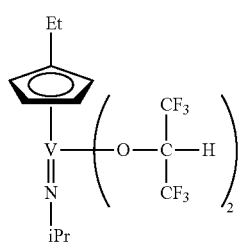
Formula 143
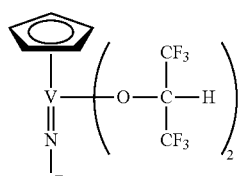
Formula 144
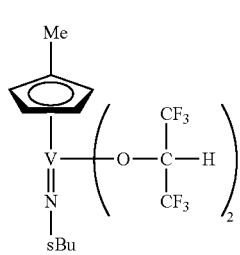
Formula 145
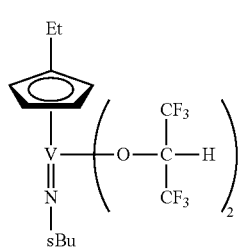
Formula 146
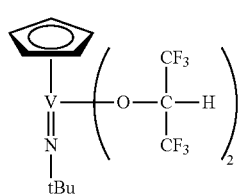
Formula 147
Formula 148

Formula 149
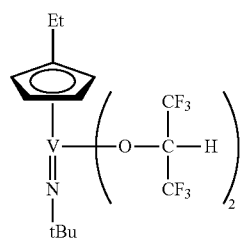
Formula 150
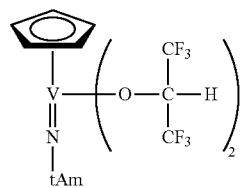
Formula 151
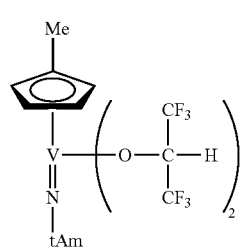
Formula 152
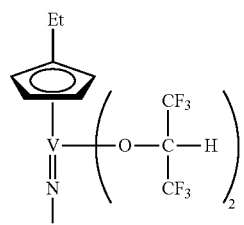
Formula 153
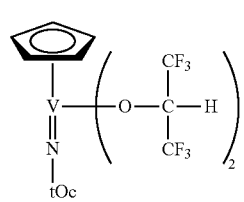
Formula 154
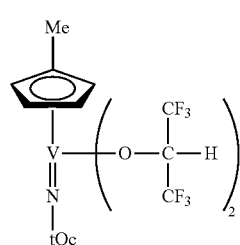
Formula 155
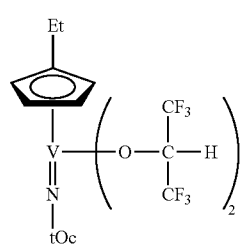
Formula 156
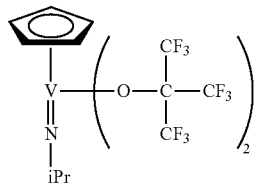
Formula 157
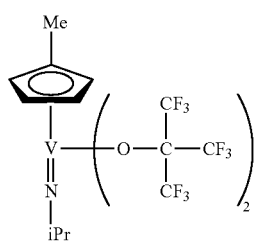
Formula 158
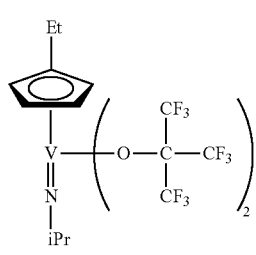
Formula 159
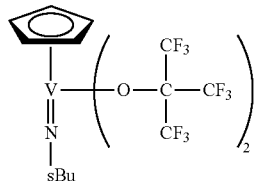
Formula 160
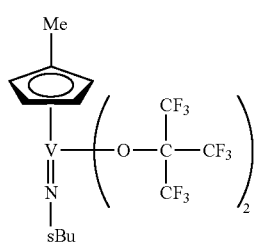
Formula 161
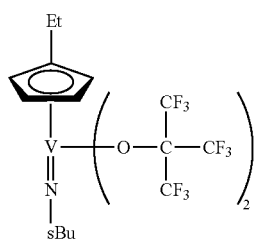
Formula 162
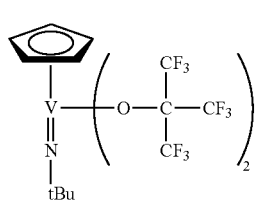

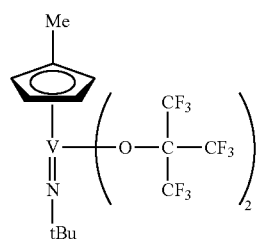
Formula 163
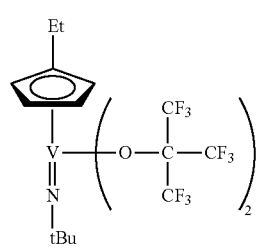
Formula 164
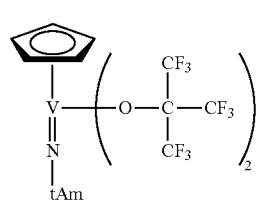
Formula 165
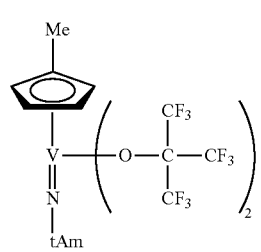
Formula 166
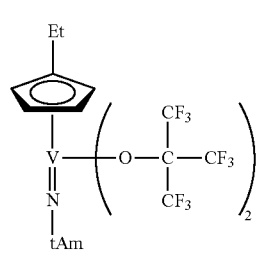
Formula 167
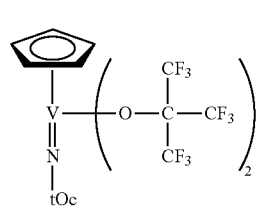
Formula 168
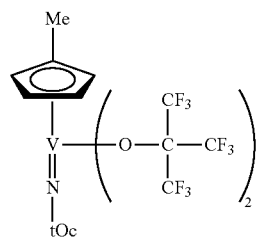
Formula 169
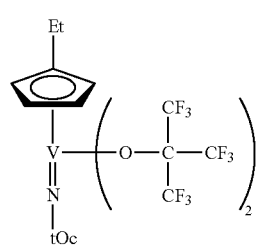
Formula 170
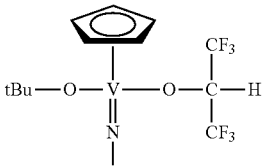
Formula 171
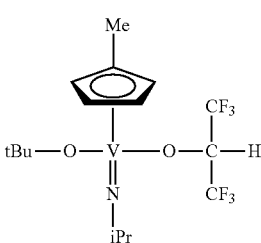
Formula 172
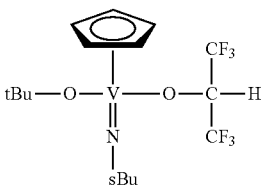
Formula 173
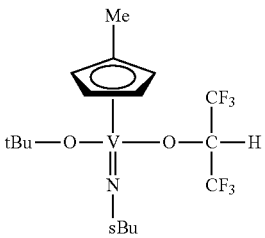
Formula 174
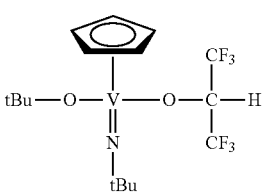
Formula 175
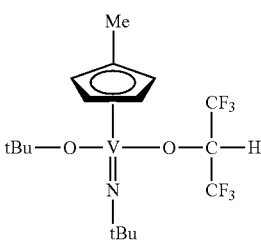
Formula 176

Formula 177
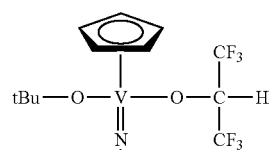
Formula 178
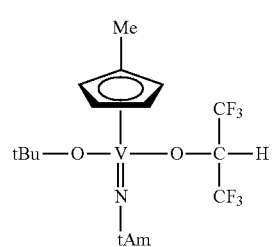
Formula 179
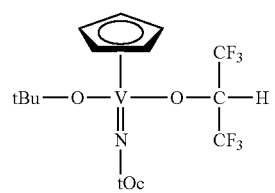
Formula 180
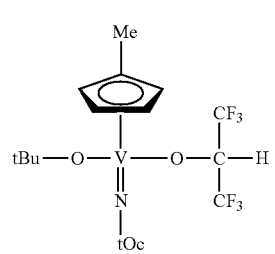
Formula 181
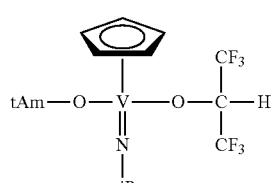
Formula 182
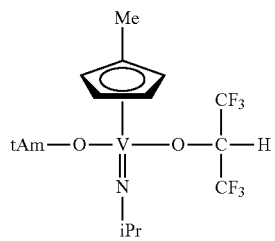
Formula 183
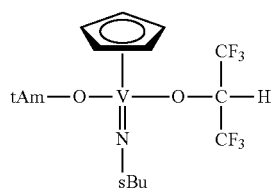
Formula 184
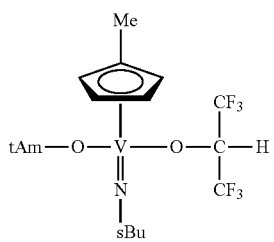
Formula 185
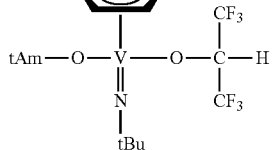
Formula 186
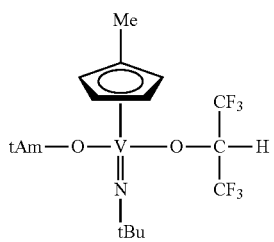
Formula 187
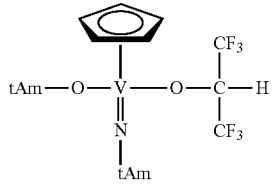
Formula 188
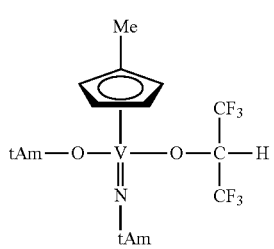
Formula 189
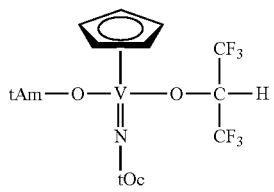
Formula 190
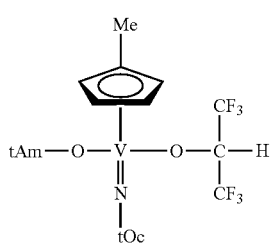

Formula 191
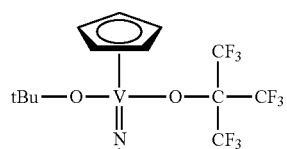
Formula 192
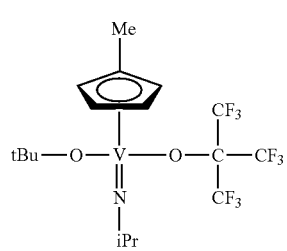
Formula 193
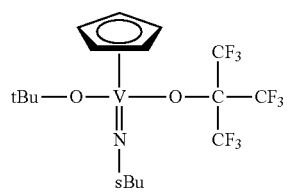
Formula 194
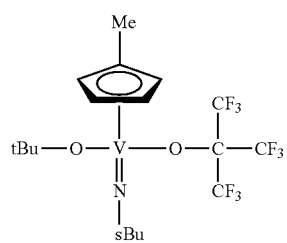
Formula 195
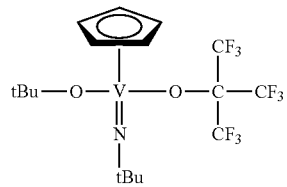
Formula 196
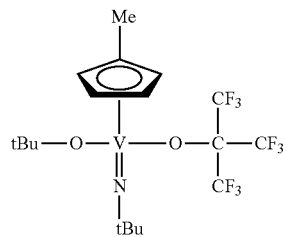
Formula 197
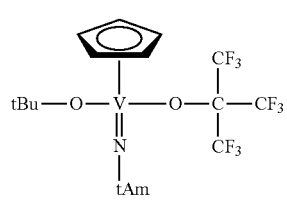
Formula 198
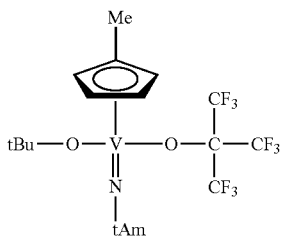
Formula 199
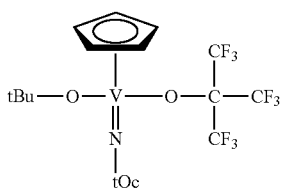
Formula 200
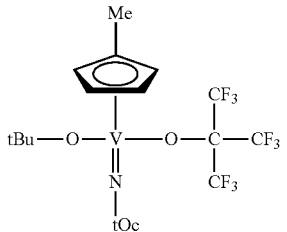
Formula 201
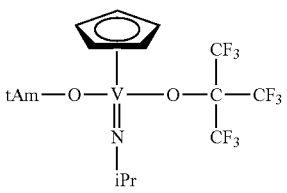
Formula 202
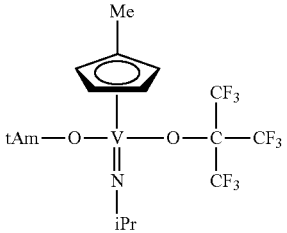
Formula 203
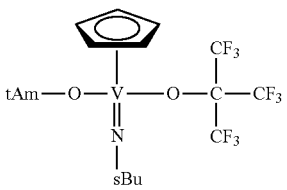
Formula 204
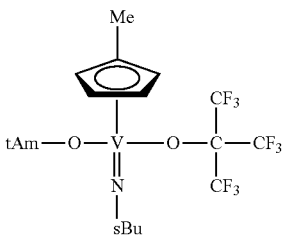

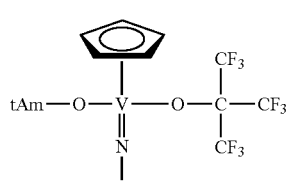

Formula 205

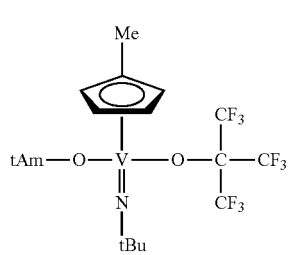

Formula 206

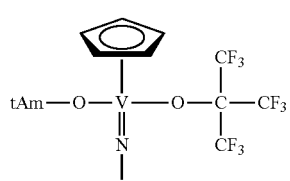

Formula 207

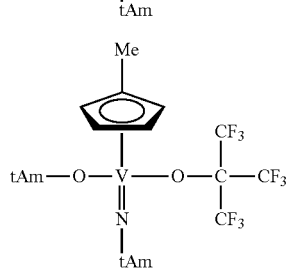

Formula 208

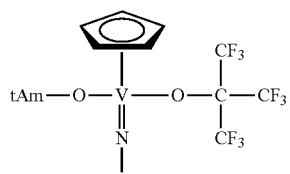

Formula 209

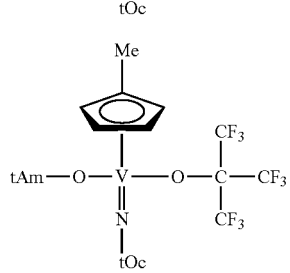

Formula 210

The organometallic compound may be prepared by using suitable synthetic methods. In an implementation, to synthesize an organometallic compound including a niobium element, to begin with, a reaction of chlorotrimethylsilane with a cyclopentadienyl compound to be synthesized may be performed in a tetrahydrofuran (THF) solvent at a temperature of about 20° C. Thereafter, the obtained resultant may be reacted with niobium pentachloride ($NbCl_5$) to obtain an intermediate. Afterwards, a reaction of the intermediate with an amine compound having an $R^4$ substituent to be synthesized may be performed in a dichloromethane solvent, and the obtained resultant may be reacted with lithium perfluoro-tert-butoxide. The solvent and unreacted products may be distilled from the obtained solution, and distillation and purification processes may be performed. In an implementation, the method of preparing the organometallic compounds may be variously modified according to substituents included in an organometallic compound according to an embodiment. To synthesize an organometallic compound including a tantalum element or an organometallic compound including a vanadium element, a process similar to the above-described process of synthesizing the organometallic compound including the niobium element may be performed except a tantalum compound or a vanadium compound instead of niobium pentachloride.

The organometallic compound according to the embodiments may be appropriately used as a source for a CVD process or an ALD process.

FIG. 1 is a flowchart of a method of manufacturing an integrated circuit (IC) device, according to embodiments.

Referring to FIG. 1, in process P10, a substrate may be prepared.

The substrate may include silicon, ceramics, glass, a metal, a metal nitride, or a combination thereof. In an implementation, the substrate may include silicon nitride, titanium nitride, tantalum nitride, silicon oxide, niobium oxide, zirconium oxide, hafnium oxide, lanthanum oxide, or a combination thereof. Each of the metal and the metal nitride may include titanium (Ti), tantalum (Ta), cobalt (Co), ruthenium (Ru), zirconium (Zr), hafnium (Hf), lanthanum (La), or a combination thereof. A surface of the substrate may have a flat, spherical, fibrous, or scalelike shape. In an implementation, the surface of the substrate may have a three-dimensional (3D) structure such as a trench structure or the like.

In an implementation, the substrate may have the same configuration as a substrate 310 that will be described below with reference to FIG. 4A.

In process P20 of FIG. 1, a metal-containing film may be formed on the substrate using a source for forming a metal-containing film, e.g., an organometallic compound of Formula (I).

The source for forming the metal-containing film may include an organometallic compound according to an embodiment. In an implementation, the source for forming the metal-containing film may include at least one of the organometallic compounds represented by Formulae 1 to 210. In an implementation, the organometallic compound may be a liquid at ambient temperature.

The source for forming the metal-containing film may vary with a thin film intended to be formed. In an implementation, a metal-containing film to be formed may include a niobium-containing film, a tantalum-containing film, or a vanadium-containing film. When the niobium-containing film is formed, an organometallic compound of Formula (I), in which M is the niobium atom, may be used as the source for forming the metal-containing film. When the tantalum-containing film is formed, an organometallic compound of Formula (I), in which M is the tantalum atom, may be used as the source for forming the metal-containing film. When the vanadium-containing film is formed, an organometallic compound of Formula (I), in which M is the vanadium atom, may be used as the source for forming the metal-containing film. In this case, the source for forming the metal-containing film may include only the organometallic compound according to the embodiment and may not include other metal compounds and semimetal compounds.

In an implementation, the metal-containing film to be formed may further include another metal in addition to niobium, tantalum, or vanadium. In an implementation, when the metal-containing film to be formed is a film further including another metal or semimetal in addition to niobium, tantalum, or vanadium, the source for forming the metal-containing film may include a compound (referred to as the term "another precursor" hereinafter) including a desired metal or semimetal, in addition to the organometallic compound according to the embodiment. In an implementation, the source for forming the metal-containing film may include an organic solvent or a nucleophilic reagent in addition to the organometallic compound according to the embodiments.

A CVD process or an ALD process may be used to form the metal-containing film according to process P20 of FIG. 1. The source for forming the metal-containing film, which includes the organometallic compound according to the embodiment, may be suitably used for chemical deposition processes, such as a CVD process or an ALD process.

When the source for forming the metal-containing film is used in the chemical deposition processes, a composition of the source for forming the metal-containing film may be appropriately selected according to a transporting method. A gas transporting method or a liquid transporting method may be used as the transporting method. When the gas transporting method is used, the source for forming the metal-containing film may be vaporized by heating and/or depressurizing in a storage container (hereinafter, referred to as a "source container") in which the source for forming the metal-containing film is stored, to generate vapor. The vapor may be introduced together with a carrier gas (e.g., argon, nitrogen, and helium) used as needed into a chamber (hereinafter, referred to as a "deposition reactor") in which a substrate is loaded. When the liquid transporting method is used, the source for forming the metal-containing film may be transported in a liquid state or a solution state to a vaporizer and heated and/or depressurized and vaporized in the vaporizer to generate vapor, and the vapor may be introduced into the chamber.

When the gas transporting method is used to form the metal-containing film according to process P20 of FIG. 1, the organometallic compound itself represented by Formula (I) may be used as the source for forming the metal-containing film. When the liquid transporting method is used to form the metal-containing film according to process P20 of FIG. 1, the organometallic compound itself represented by Formula (I) or a solution in which the organometallic compound of Formula (I) is dissolved in an organic solvent may be used as the source for forming the metal-containing film. The source for forming the metal-containing film may further include another precursor, a nucleophilic reagent, or the like.

In an implementation, a multi-component CVD process may be used to form a metal-containing film in the method of manufacturing the IC device, according to the embodiment. The multi-component CVD process may be performed by using a method (hereinafter, referred to as a "single source method") of independently vaporizing and supplying respective components of a source for forming a metal-containing film or a method (hereinafter, referred to as a "cocktail source method") of vaporizing and supplying a source mixture obtained by previously mixing multi-component sources in a desired composition. When the cocktail source method is used, a mixture of the organometallic compound according to the embodiment and another precursor or a mixed solution obtained by dissolving the mixture in an organic solvent may be used as the source for forming the metal-containing film. The mixture or the mixed solution may further include a nucleophilic reagent.

The organic solvent may include, e.g., acetate esters such as ethyl acetate, n-butyl acetate, and methoxyethyl acetate; ethers such as tetrahydrofuran, tetrahydropyran, ethylene glycol dimethyl ether, diethylene glycol dimethyl ether, triethylene glycol dimethyl ether, and dibutyl ether; ketones such as methyl butyl ketone, methyl isobutyl ketone, ethyl butyl ketone, dipropyl ketone, diisobutyl ketone, methyl amyl ketone, cyclohexanone, methyl cyclohexanone; hydrocarbons such as hexane, cyclohexanone, cyclohexane, dimethylcyclohexane, ethylcyclohexane, heptane, octane, toluene, and xylene; hydrocarbons having a cyano group such as cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; or lutidine. The above-described organic solvents may be used alone or in a mixture of at least two kinds thereof considering solubilities, use temperatures, boiling points, and ignition points of solutes.

When the organic solvent is included in the source for forming the metal-containing film, which includes the organometallic compound according to the embodiment, the total amount of the organometallic compound according to the embodiment and the other precursor may range from about 0.01 mol/L to about 2.0 mol/L, e.g., about 0.05 mol/L to about 1.0 mol/L, in the organic solvent. Here, the total amount refers to the amount of the organometallic compound according to the embodiment when the source for forming the metal-containing film does not include a metal compound and a semimetal compound other than the organometallic compound according to the embodiment, and refers to the sum of amounts of the organometallic compound according to the embodiment and another precursor when the source for forming the metal-containing film includes the organometallic compound according to the embodiment and another metal compound or semimetal compound (i.e., the other precursor).

In the method of manufacturing the IC device, according to the embodiment, when the multi-component CVD process is used to form the metal-containing film, a kind of another precursor that may be used together with the organometallic compound according to the embodiment may be a suitable precursor, and precursors that may be used as sources for forming the metal-containing film may be adopted.

In an implementation, the other precursor that may be used to form a metal-containing film in the method of manufacturing the IC device, according to the embodiment, may include an organic coordination compound including an alcohol compound, a glycol compound, a β-diketone compound, a cyclopentadiene compound, or an organic amine compound.

In an implementation, the other precursor may include lithium (Li), sodium (Na), potassium (K), magnesium (Mg), calcium (Ca), strontium (Sr), barium (Ba), titanium (Ti), zirconium (Zr), hafnium (Hf), chromium (Cr), molybdenum (Mo), tungsten (W), manganese (Mn), iron (Fe), cobalt (Co), rhodium (Rh), iridium (Ir), nickel (Ni), palladium (Pd), platinum (Pt), copper (Cu), silver (Ag), gold (Au), zinc (Zn), aluminum (Al), gallium (Ga), indium (In), germanium (Ge), tin (Sn), lead (Pb), antimony (Sb), bismuth (Bi), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu).

An alcohol compound that may be used as the organic coordination compound of the other precursor may include, e.g., alkyl-alcohols such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether-alcohols such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, 1,1-diethylethanol, and 3-methoxy-1,1-dimethylpropanol; or dialkylaminoalcohols such as dimethyl amino ethanol, ethyl methyl amino ethanol, diethyl amino ethanol, dimethyl amino-2-pentanol, ethyl methyl amino-2-pentanol, and diethyl amino-2-methyl-2-pentanol.

A glycol compound that may be used as the organic coordination compound of the other precursor may include, e.g., 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, or 2,4-dimethyl-2,4-pentanediol.

A β-diketone compound that may be used as the organic coordination compound of the other precursor may include, e.g., alkyl-substituted β-diketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones such as 1,1,5,5-tetramethyl-1-methoxyhexane-2,4-dione, 2,2,6,6-tetramethyl-1-methoxyheptane-3,5-dione, or 2,2,6,6-tetramethyl-1-(2-methoxyethoxy)heptane-3,5-dione.

A cyclopentadiene compound that may be used as the organic coordination compound of the other precursor may include, e.g., cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclepentadiene, dimethylcyclopentadiene, or tetramethylcyclopentadiene.

An organic amine compound that may be used as the organic coordination compound of the other precursor may include, e.g., methylamine, ethylamine, propylamine, isopropylamine, butyl amine, sec-butyl amine, tert-butyl amine, isobutyl amine, dimethylamine, diethylamine, dipropylamine, diisopropylamine, ethylmethylamine, propylmethylamine, or isopropylmethylamine.

The other precursor may be a suitable material, and a method of preparing the other precursor may be a suitable method. In an implementation, when an alcohol compound is used as an organic ligand, a precursor may be prepared by reacting an inorganic salt of the above-described element or a hydrate thereof with an alkali metal alkoxide of the corresponding alcohol compound. Here, the inorganic salt of the above-described element or the hydrate thereof may include, e.g., a metal halide or a metal nitrate. The alkali metal alkoxide may include, e.g., sodium alkoxide, lithium alkoxide, or potassium alkoxide.

When the single source method is used, the other precursor may include a compound that is similar in thermal and/or oxidative decomposition behavior to the organometallic compound according to the embodiment. When the cocktail source method is used, the other precursor may include a material, which is similar in thermal and/or oxidative decomposition behavior to the organometallic compound according to the embodiment, and may not deteriorate due to a chemical reaction when mixed with the organometallic compound according to the embodiment.

In an implementation, to form the metal-containing film using the method of manufacturing the IC device, according to the embodiment, the source for forming the metal-containing film may include a nucleophilic reagent. The nucleophilic reagent may give stability to the organometallic compound including a niobium atom, a tantalum atom, or a vanadium atom, according to the embodiment, and/or the other precursor. The nucleophilic reagent may include ethylene glycol ethers such as glyme, diglyme, triglyme, and tetraglyme; crown ethers such as 18-crown-6, dicyclohexyl-18-crown-6, 24-crown-8, dicyclohexyl-24-crown-8, and dibenzo-24-crown-8; polyamines such as ethylene diamine, N,N'-tetramethylethyl diamine, diethylene triamine, triethylene teramine, tetraethylene pentamine, pentaethylene hexamine, 1,1,4,7,7-pentamethyldiethylene triamine, 1,1,4,7,10,10-hexamethyltriethylene tetramine, and triethoxytriethylene amine; cyclic polyamines such as cyclam and cyclen; heterocyclic compounds such as pyridine, pyrrolidine, piperidine, morpholine, N-methyl pyrrolidine, N-methyl piperidine, N-methyl morpholine, tetrahydrofurane, tetrahydropyran, 1,4-dioxane, oxazole, thiazole, and oxathiolane; β-ketone esters such as methyl acetoacetate, ethyl acetoacetate, 2-methoxyethyl acetoacetate; or β-diketones such as acetylacetone, 2,4-hexanedione, 2,4-heptanedione, 3,5-heptanedione, and dipivaloyl methane. The nucleophilic reagent may be used in an amount of about 0.1 mol to about 10 mol, e.g., about 1 mol to about 4 mol, based on 1 mol of the total amount of the precursor.

In the source for forming the metal-containing film, which is used to form the metal-containing film by using the method of manufacturing the IC device, according to the embodiment, the amounts of an impurity metal element, impurity halogen (e.g., impurity chlorine), and an impurity organic material may be suppressed as much as possible. In an implementation, one type of metal may be included as the impurity metal element in an amount of about 100 ppb or less in the source for forming the metal-containing film. In an implementation, one type of metal may be included as the impurity metal element in the source for forming the metal-containing film in an amount of about 10 ppb or less. In an implementation, the total amount of impurity metals may be included in the source for forming the metal-containing film in an amount of about 1 ppm or less, e.g., about 100 ppb or less. In an implementation, when a metal-containing film used as a gate insulating film, a gate conductive film, or a barrier film, which constitutes a large-scale integration (LSI) circuit, is formed, the contents of an alkali metal element and an alkali earth metal element, which affect the electrical characteristics of a resultant thin film, may be minimized. In an implementation, the impurity halogen component may be included in the source for forming the metal-containing film in an amount of about 100 ppm or less, e.g., about 10 ppm or less, or about 1 ppm or less.

The impurity organic component may be included in the source for forming the metal-containing film in an amount of about 500 ppm or less, e.g., about 50 ppm or less, or about 10 ppm or less, based on the total amount of the source for forming the metal-containing film.

In the source for forming the metal-containing film, moisture may cause particles in the source for forming the metal-containing film or cause particles during a thin-film forming process. In an implementation, the moisture of each of the precursor, the organic solvent, and the nucleophilic reagent may be previously removed before use thereof. A moisture content of each of the precursor, the organic solvent, and the nucleophilic reagent may be about 10 ppm or less, e.g., about 1 ppm or less.

When the metal-containing film is formed by using the method of manufacturing the IC device, according to the embodiment, content of particles in the source for forming the metal-containing film may be minimized to reduce the contamination of the metal-containing film to be formed with particles. In an implementation, when particles are measured in a liquid state by using a light-scattering-type particle detector, the number of particles having a size of more than about 0.3 m may be adjusted to 100 or less in 1 ml of a liquid. In an implementation, the number of particles having a size of more than about 0.2 m may be adjusted to 1,000 or less, e.g., 100 or less, in 1 ml of a liquid.

In process P20 of FIG. 1, the formation of the metal-containing film using the source including the organometallic compound of Formula (I) may include a process of vaporizing the source for forming the metal-containing film, introducing the source for forming the metal-containing film into the deposition reactor in which the substrate is loaded, and depositing the source for forming the metal-containing film on the surface of the substrate to form a precursor thin film on the substrate and a process of causing a reaction of the precursor thin film with a reactive gas to form the metal-containing film including a niobium atom, a tantalum atom, or a vanadium atom on the surface of the substrate.

To vaporize the source for forming the metal-containing film and introduce the source for forming the metal-containing film into the deposition reactor, the gas transporting method, the liquid transporting method, the single source method, or the cocktail source method, which is described above, or the like may be used.

The reactive gas may be a gas that reacts with the precursor thin film. In an implementation, the reactive gas may include an oxidizing gas, a reducing gas, or a nitriding gas.

The oxidizing gas may include, e.g., $O_2$, $O_3$, $O_2$ plasma, $H_2O$, $NO_2$, NO, nitrous oxide ($N_2O$), CO, $CO_2$, $H_2O_2$, HCOOH, $CH_3COOH$, $(CH_3CO)_2O$, an alcohol, a peroxide, sulfur oxide, or a combination thereof.

The reducing gas may include, e.g., $H_2$.

The nitriding gas may include, e.g., $NH_3$, $N_2$ plasma, mono-alkyl amine, di-alkylamine, tri-alkylamine, an organic amine compound (e.g., alkylenediamine), a hydrazine compound, or a combination thereof.

When a metal oxide film including a niobium atom, a tantalum atom, or a vanadium atom is formed in process P20 of FIG. 1, the oxidizing gas may be used as the reactive gas. When a metal nitride film including a niobium atom, a tantalum atom, or a vanadium atom is formed in process P20 of FIG. 1, the nitriding gas may be used as the reactive gas.

In an implementation, in process P20 of FIG. 1, the metal-containing film including the niobium atom, the tantalum atom, or the vanadium atom may be formed by using a thermal CVD process of forming a thin film by reacting a source gas including the organometallic compound according to the embodiment or both the source gas and a reactive gas due to only heat, a plasma CVD process using heat and plasma, a photo-CVD process using heat and light, a photo-plasma CVD process using heat, light, and plasma, or an ALD process.

When the metal-containing film is formed according to process P20 of FIG. 1, a reaction temperature (or a substrate temperature), reaction pressure, a deposition rate, or the like may be appropriately selected according to a desired thickness and type of a desired metal-containing film. The reaction temperature may be a temperature at which the source for forming the metal-containing film may sufficiently react. In an implementation, the reaction temperature may be selected in the range of ambient temperature to about 500° C., e.g., a range of about 150° C. to about 400° C. or a range of about 250° C. to about 450° C.

When the process of forming the metal-containing film according to process P20 of FIG. 1 is performed using an ALD process, a film thickness of the metal-containing film may be controlled by adjusting the number of cycles of the ALD process. The formation of the metal-containing film on the substrate using the ALD process may include a source gas introduction process in which vapor formed by vaporizing a source for forming a metal-containing film, which includes the organometallic compound according to the embodiment, is introduced into the deposition reactor, a precursor thin film forming process in which a precursor thin film is formed on the surface of the substrate by using the vapor, an exhaust process in which unreacted source gases remaining on the substrate are exhausted from a reaction space, and a process in which the precursor thin film is chemically reacted with a reactive gas to form the metal-containing film on the surface of the substrate.

In an implementation, the process of vaporizing the source for forming the metal-containing film may be performed in a source container or a vaporizer. The process of vaporizing the source for forming the metal-containing film may be performed at a temperature of about 0° C. to about 200° C. When the source for forming the metal-containing film is vaporized, inner pressure of the source container or the vaporizer may be in the range of about 1 Pa to about 10,000 Pa.

Figure 2:
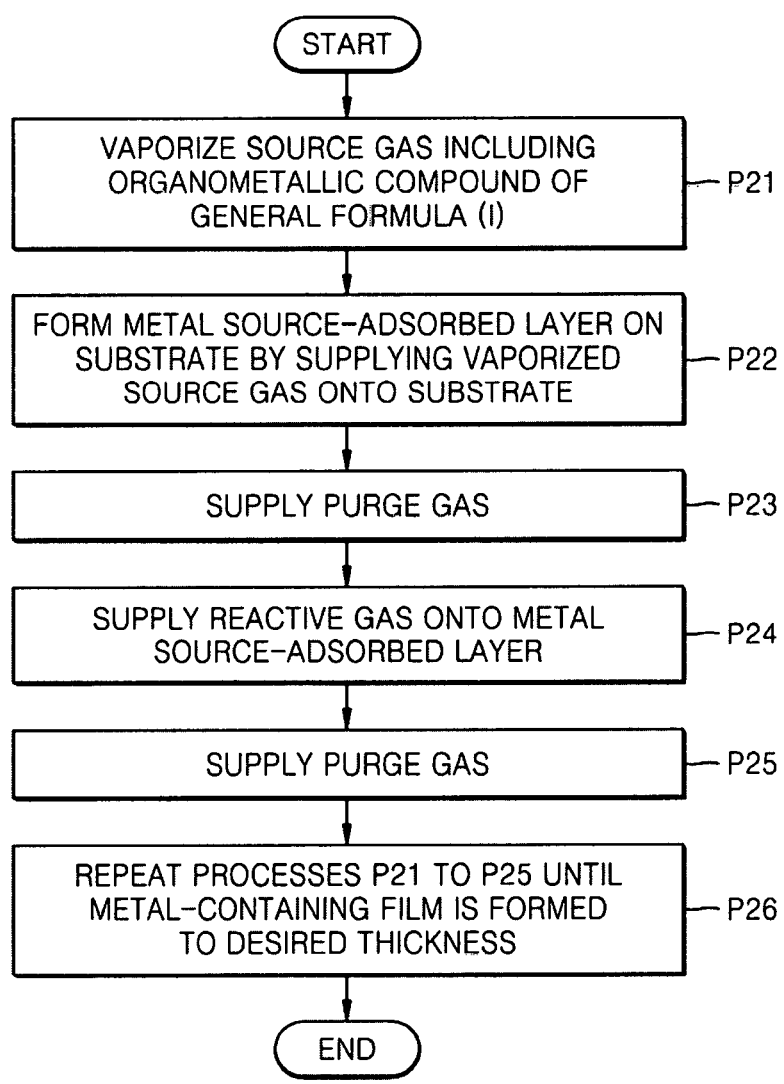
FIG. 2 is a detailed flowchart of a method of forming a metal-containing film by using a method of manufacturing an IC device, according to example embodiments.

FIG. 2 is a detailed flowchart of a method of forming a metal-containing film by using a method of manufacturing an IC device, according to example embodiments. A method of forming the metal-containing film by using an ALD process according to process P20 of FIG. 1 will be described with reference to FIG. 2.

Referring to FIG. 2, in process P21, a source gas including an organometallic compound having a structure of Formula (I) may be vaporized.

In an implementation, the source gas may include a source for forming the metal-containing film, which is described above. The process of vaporizing the source gas may be performed at a temperature of about 0° C. to about 200° C. When the source gas is vaporized, inner pressure of a source container or a vaporizer may range from about 1 Pa to about 10,000 Pa.

In process P22 of FIG. 2, the source gas vaporized according to process P21 may be supplied onto a substrate, and thus, a metal source-adsorbed layer including a niobium atom, a tantalum atom, or a vanadium atom may be formed on the substrate. In this case, a reaction temperature may be in the range of ambient temperature to about 500° C., e.g., a range of about 150° C. to about 400° C. or a range of about 250° C. to about 450° C. A reaction pressure may be in the range of about 1 Pa to about 10,000 Pa, e.g., about 10 Pa to about 1,000 Pa.

By supplying the vaporized source gas onto the substrate, an adsorbed layer including a chemisorbed layer and a physisorbed layer of the vaporized source gas may be formed on the substrate.

In process P23 of FIG. 2, unnecessary by-products remaining on the substrate may be removed by supplying a purge gas onto the substrate.

In an implementation, an inert gas, such as argon (Ar), helium (He), and neon (Ne), or nitrogen ($N_2$) gas may be used as the purge gas.

In an implementation, instead of the purge gas, a reaction space in which the substrate is loaded may be exhausted by reducing pressure of the reaction space. In this case, to reduce the pressure of the reaction chamber, the reaction space may be maintained under pressure of about 0.01 Pa to about 300 Pa, e.g., about 0.01 Pa to about 100 Pa.

In an implementation, a process of heating the substrate on which the metal source-adsorbed layer including the niobium atom, the tantalum atom, or the vanadium atom is formed or a process of annealing a reaction chamber containing the substrate may be further performed. The annealing process may be performed at ambient temperature to a temperature of about 500° C., e.g., at a temperature of about 50° C. to about 400° C.

In process P24 of FIG. 2, a reactive gas may be supplied onto the metal source-adsorbed layer formed on the substrate, and thus, a metal-containing film may be formed on an atomic level.

In an implementation, when a metal oxide film including a niobium atom, a tantalum atom, or a vanadium atom is formed on the substrate, the reactive gas may be an oxidizing gas, e.g., $O_2$, $O_3$, $O_2$ plasma, $H_2O$, $NO_2$, NO, nitrous oxide ($N_2O$), CO, $CO_2$, $H_2O_2$, HCOOH, $CH_3COOH$, $(CH_3CO)_2O$, an alcohol, a peroxide, sulfur oxide, or a combination thereof.

In an implementation, when a metal nitride film including a niobium atom, a tantalum atom, or a vanadium atom is formed on the substrate, the reactive gas may be a nitriding gas, e.g., $NH_3$, $N_2$ plasma, mono-alkyl amine, di-alkylamine, tri-alkylamine, an organic amine compound such as alkylene diamine, a hydrazine compound, or a combination thereof.

In an implementation, the reactive gas may be a reducing gas, e.g., $H_2$.

In process P24 of FIG. 2, the reaction space may be maintained at ambient temperature to a temperature of about 500° C., e.g., at a temperature of about 150° C. to about 400° C. or at a temperature of about 250° C. to about 450° C. such that the metal source-adsorbed layer including the niobium atom, the tantalum atom, or the vanadium atom may sufficiently react with the reactive gas. In process P24, pressure of the reaction space may range from about 1 Pa to about 10,000 Pa, e.g., about 10 Pa to about 1,000 Pa.

In process P24 of FIG. 2, the reactive gas may be processed with plasma. During the plasma processing process, a radio-frequency (RF) output may range from about 0 W to about 1,500 W, e.g., about 50 W to about 600 W.

In process P25 of FIG. 2, unnecessary by-products remaining on the substrate may be removed by supplying a purge gas onto the substrate.

For example, an inert gas, such as argon (Ar), helium (He), and neon (Ne), or nitrogen ($N_2$) gas may be used as a purge gas.

In process P26 of FIG. 2, processes P21 to P25 of FIG. 2 may be repeated until the metal-containing film is formed to a desired thickness.

A thin-film deposition process including a series of processes, e.g., processes P21 to P25, may be defined as one cycle, and the cycle may be repeated a plurality of times until the metal-containing film is formed to a desired thickness. In an implementation, after the cycle is performed once, unreacted gases may be exhausted from the reaction chamber by performing an exhaust process using a purge gas, which is similar to that of process P23 or P25, and subsequent cycles may be then performed.

In an implementation, conditions (e.g., vaporization temperatures or vaporization pressures of sources) for supplying sources, a reaction temperature, and a reaction pressure may be adjusted to control a deposition rate of the metal-containing film. When the deposition rate of the metal-containing film is excessively high, characteristics of the obtained metal-containing film may be degraded, whereas, when the deposition rate of the metal-containing film is excessively low, productivity may be reduced. In an implementation, the deposition rate of the metal-containing film may be in the range of about 0.01 nm/min to about 100 nm/min, e.g., about 1 nm/min to about 50 nm/min.

The method of forming the metal-containing film, which has been described with reference to FIG. 2, is an example, and various modifications and changes of the method may be made.

In an implementation, to form the metal-containing film on the substrate, the organometallic compound having a structure of Formula (I) and at least one other precursor, a reactive gas, a carrier gas, and a purge gas may be simultaneously or sequentially supplied onto the substrate. Details of the other precursor, the reactive gas, the carrier gas, and the purge gas, which may be supplied onto the substrate together with the organometallic compound represented by Formula (I), are as described above.

In an implementation, in the process of forming the metal-containing film, which has been described with reference to FIG. 2, the reactive gas may be supplied onto the substrate between processes P21 to P25.

FIGS. 3A to 3D are diagrams of configurations of deposition systems 200A, 200B, 200C, and 200D, which may be used to form a metal-containing film in a method of manufacturing an IC device, according to example embodiments.

Each of the deposition systems 200A, 200B, 200C, and 200D shown in FIGS. 3A to 3D may include a fluid transmission unit 210, a thin-film formation unit 250 configured to perform a deposition process of forming a thin film on a substrate W by using a process gas supplied from a source container 212 included in the fluid transmission unit 210, and an exhaust system 270 configured to exhaust gases or by-products, which could remain after a reaction occurs in the thin-film formation unit 250.

The thin-film formation unit 250 may include a reaction chamber 254 including a susceptor 252 configured to support the substrate W. A shower head 256 may be installed at a top end unit of the inside of the reaction chamber 254. The shower head 256 may be configured to supply gas supplied from the fluid transmission unit 210 onto the substrate W.

The fluid transmission unit 210 may include an inlet line 222 configured to supply a carrier gas from the outside to the source container 212 and an outlet line 224 configured to supply a source compound contained in the source container 212 to the thin-film formation unit 250. A valve V1 and a mass flow controller (MFC) M1 may be installed at the inlet line 222, and a valve V2 and an MFC M2 may be installed at the outlet line 224. The inlet line 222 and the outlet line 224 may be connected to each other through a bypass line 226. A valve V3 may be installed at the bypass line 226. The valve V3 may operate due to pneumatic pressure by using an electric motor or another remote control unit.

The source compound supplied from the source container 212 may be supplied into the reaction chamber 254 through an inlet line 266 of the thin-film formation unit 250, which is connected to the outlet line 224 of the fluid transmission unit 210. In an implementation, the source compound supplied from the source container 212 may be supplied into the reaction chamber 254 together with a carrier gas supplied through an inlet line 268. A valve V4 and an MFC M3 may be installed at the inlet line 268 into which the carrier gas is supplied.

The thin-film formation unit 250 may include an inlet line 262 configured to supply a purge gas into the reaction chamber 254 and an inlet line 264 configured to supply a reactive gas. A valve V5 and an MFC M4 may be installed at the inlet line 262, and a valve V6 and an MFC M5 may be installed at the inlet line 264.

The process gas used in the reaction chamber 254 and reaction by-products to be discarded may be exhausted to the outside through an exhaust system 270. The exhaust system 270 may include an exhaust line 272 connected to the reaction chamber 254 and a vacuum pump 274 installed at the exhaust line 272. The vacuum pump 274 may eliminate the process gas and the reaction by-products, which are exhausted from the reaction chamber 254.

A trap 276 may be installed in the exhaust line 272 at an upstream side of the vacuum pump 274. The trap 276 may trap, e.g., reaction by-products, which are generated by unreacted process gases in the reaction chamber 254, and prevent the reaction by-products from flowing into the vacuum pump 274 at a downstream side.

The trap 276 installed at the exhaust line 272 may trap attachments (e.g., reaction by-products), which may occur due to a reaction between the process gases, and prevent the attachments from flowing to a downstream side of the trap 276. The trap 276 may be configured to be cooled by a cooler or a water cooling device.

In addition, a bypass line 278 and an automatic pressure controller (APC) 280 may be installed in the exhaust line 272 at an upstream side of the trap 276. A valve V7 may be installed at the bypass line 278, and a valve V8 may be installed at a portion of the exhaust line 272, which may extend parallel to the bypass line 278.

Figure 3A:
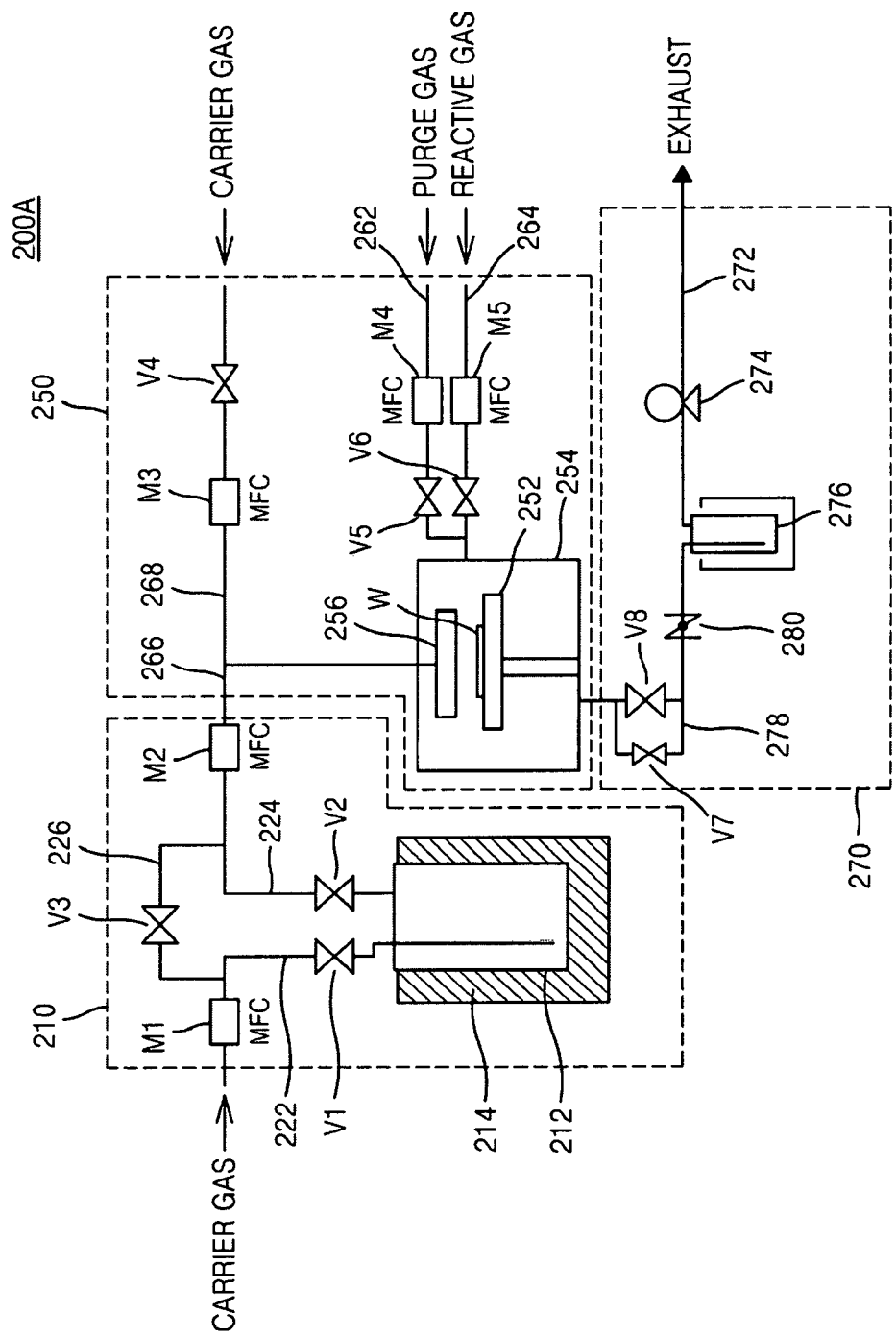
FIGS. 3A to 3D are diagrams of configurations of deposition systems, which may be used to form a metal-containing film in a method of manufacturing an IC device, according to example embodiments.
Figure 3B:
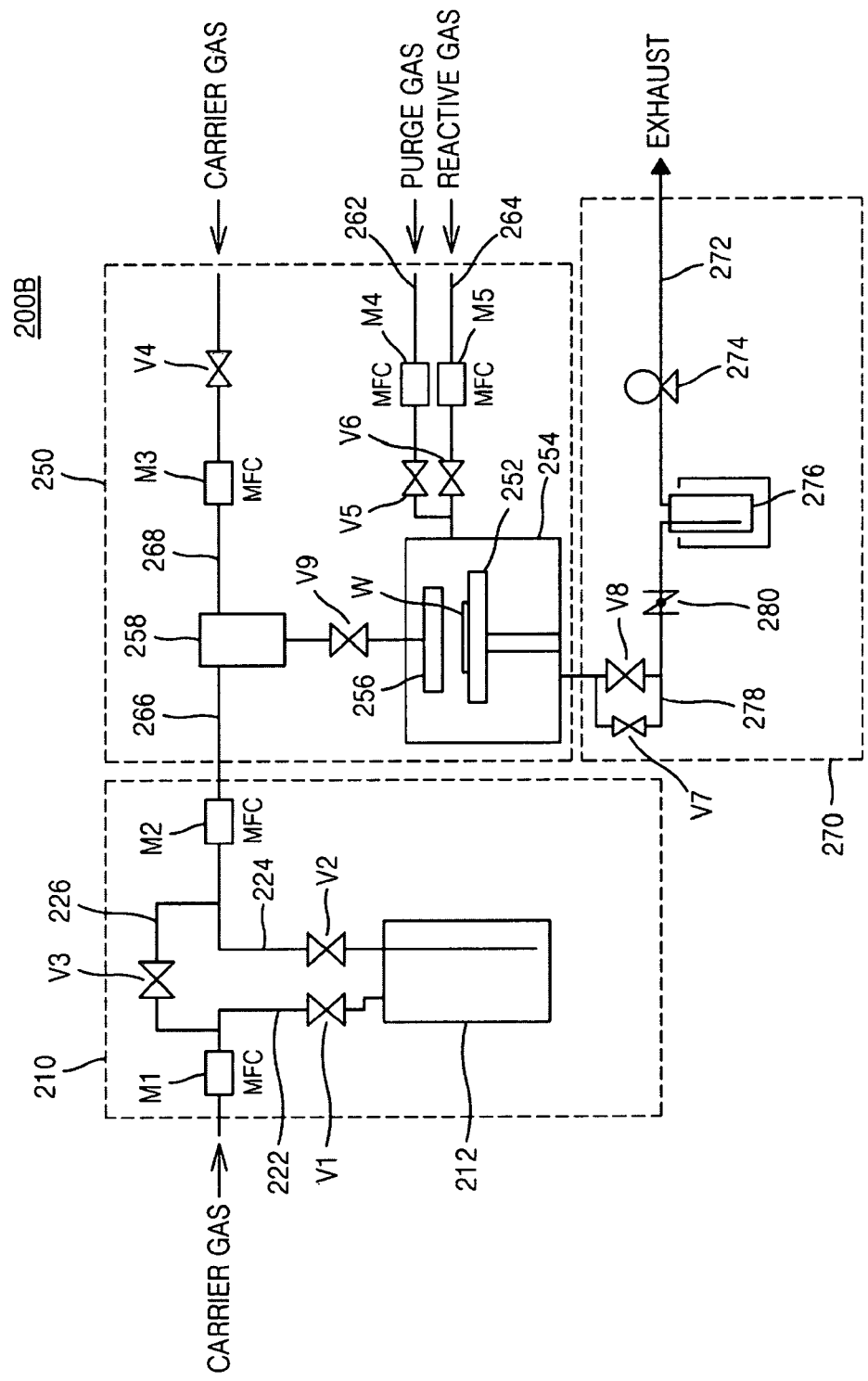
Figure 3C:
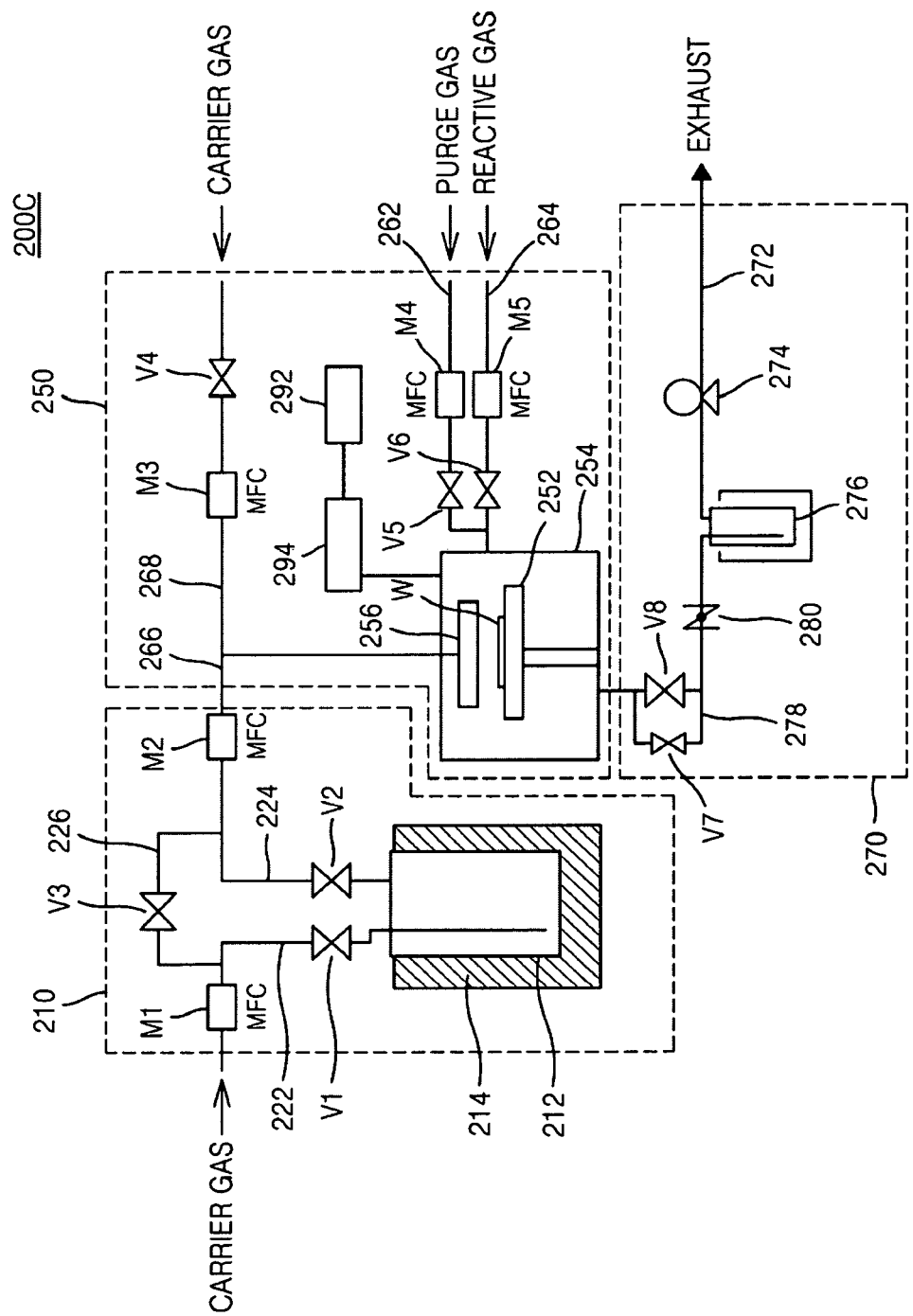

As in the deposition systems 200A and 200C shown in FIGS. 3A and 3C, a heater 214 may be installed in the source container 212. A source compound contained in the source container 212 may be maintained at a relatively high temperature by the heater 214.

Figure 3D:
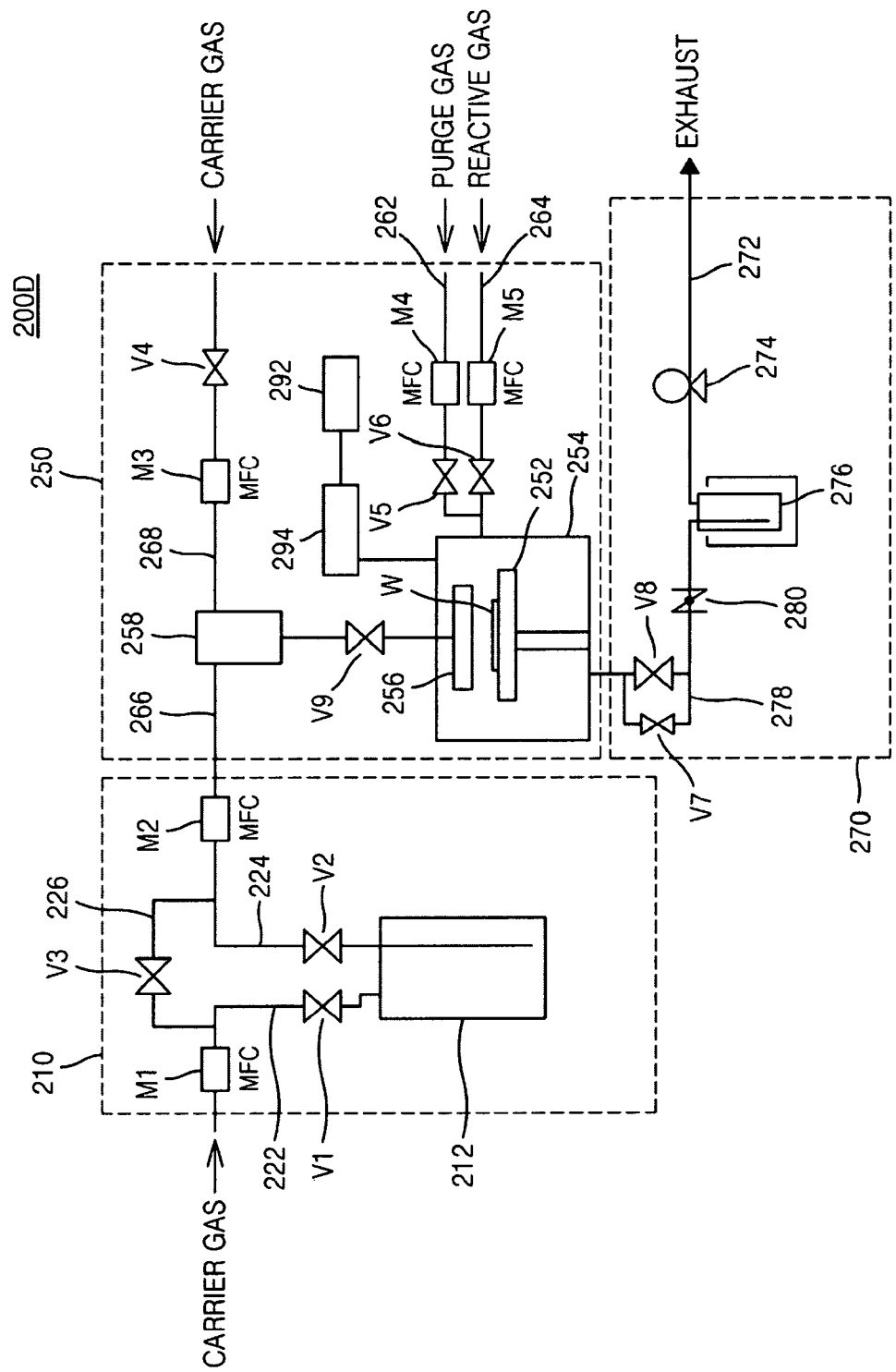

As in the deposition systems 200B and 200D shown in FIGS. 3B and 3D, a vaporizer 258 may be installed at the inlet line 266 of the thin-film formation unit 250. The vaporizer 258 may vaporize a fluid supplied in a liquid state from the fluid transmission unit 210 and supply the vaporized source compound into the reaction chamber 254. The source compound vaporized by the vaporizer 258 may be supplied into the reaction chamber 254 together with a carrier gas supplied through the inlet line 268. The supplying of the source compound into the reaction chamber 254 through the vaporizer 258 may be controlled by a valve V9.

In an implementation, as in the deposition systems 200C and 200D shown in FIGS. 3C and 3D, to generate plasma in the reaction chamber 254, the thin-film formation unit 250 may include a radio-frequency (RF) power source 292 and an RF matching system 294, which are connected to the reaction chamber 254.

FIGS. 3A to 3D illustrate the deposition systems 200A, 200B, 200C, and 200D in which one source container 212 is connected to the reaction chamber 254. In an implementation, a plurality of source containers 212 may be provided in the fluid transmission unit 210, and each of the plurality of source containers 212 may be connected to the reaction chamber 254. The number of source containers 212 connected to the reaction chamber 254 may vary.

In an implementation, the source for forming the metal-containing film, which includes an organometallic compound of Formula (I), may be vaporized by using the vaporizer 258 in any one of the deposition systems 200B and 200D shown in FIGS. 3B and 3D.

In the method of manufacturing the IC device, which has been described with reference to FIGS. 1 and 2, any one of the deposition systems 200A, 200B, 200C, and 200D shown in FIGS. 3A to 3D may be used to form the metal-containing film on the substrate W. To form the metal-containing film on the substrate W, the organometallic compound of Formula (I), according to the embodiment, may be transported by using various methods and supplied into a reaction space of a thin-film forming system, for example, the reaction chamber 254 of each of the deposition systems 200A, 200B, 200C, and 200D shown in FIGS. 3A to 3D.

In an implementation, to form the metal-containing film according to the method described with reference to FIGS. 1 and 2, the metal-containing film may be simultaneously formed on a plurality of substrates by using a batch-type apparatus instead of a single-type apparatus, such as the deposition systems 200A, 200B, 200C, and 200D shown in FIGS. 3A to 3D.

When the metal-containing film is formed by using the method of manufacturing the IC device, according to the embodiment, conditions for forming the metal-containing film may include a reaction temperature (or substrate temperature), reaction pressure, and a deposition speed.

The reaction temperature may be a temperature at which an organometallic compound according to an embodiment, e.g., the organometallic compound of Formula (I), may sufficiently react. In an implementation, the reaction temperature may be a temperature of about 150° C. or higher. In an implementation, the reaction temperature may be in the range of about 150° C. to about 400° C. or in the range of about 250° C. to about 450° C.

The reaction pressure may be selected in the range of about 10 Pa to pressure of atmospheric pressure in the case of a thermal CVD process or a photo-CVD process, and in the range of about 10 Pa to about 2,000 Pa in the case of a plasma CVD process.

A deposition speed may be controlled by adjusting conditions (e.g., a vaporization temperature and vaporization pressure) for supplying a source compound, a reaction temperature, and a reaction pressure. In the method of manufacturing the IC device, according to the embodiment, a deposition speed of the metal-containing film may be in the range of about 0.01 nm/min to about 100 nm/min, e.g., in the range of about 1 nm/min to about 50 nm/min. When the metal-containing film is formed by using an ALD process, the number of cycles of the ALD process may be adjusted to control a thickness of the metal-containing film.

In an implementation, when a metal-containing film is formed using an ALD process, energy (e.g., plasma, light, and/or a voltage) may be applied. A time for which the energy is applied may be variously selected. In an implementation, the energy (e.g., plasma, light, and a voltage) may be applied when a source gas including the organometallic compound is introduced into a reaction chamber, when the source gas is adsorbed on the substrate W, when an exhaust process is performed using the purge gas, when the reactive gas is introduced into the reaction chamber, or between respective time periods for which the processes described above are performed.

In an implementation, after the metal-containing film is formed using the organometallic compound of Formula (I), a process of annealing the metal-containing film under an inert atmosphere, an oxidizing atmosphere, or a reducing atmosphere may be further performed. In an implementation, to remove a roughness from the surface of the metal-containing film, a reflow process may be performed on the metal-containing film as desired. Each of the annealing process and the reflow process may be performed under temperature conditions selected in the range of about 200° C. to about 1,000° C., e.g., about 250° C. to about 500° C.

In an implementation, various types of metal-containing films may be formed by appropriately selecting the organometallic compound according to the embodiment, the other precursor, which may be used together with the organometallic compound, the reactive gas, and conditions for forming thin films. In an implementation, the metal-containing film formed using the method according to the embodiment may include a niobium atom, a tantalum atom, or a vanadium atom. In an implementation, the metal-containing film may include a niobium film, a niobium oxide film, a niobium nitride film, a niobium alloy film, a niobium-containing composite oxide film, a tantalum film, a tantalum oxide film, a tantalum nitride film, a tantalum alloy film, a tantalum-containing composite oxide film, a vanadium film, a vanadium oxide film, a vanadium nitride film, a vanadium alloy film, or a vanadium-containing composite oxide film. The niobium alloy film may include a Nb—Hf alloy or a Nb—Ti alloy. The tantalum alloy film may include a Ta—Ti alloy or a Ta—W alloy. The metal-containing film formed using the method according to the embodiment may be used as a material for various components included in an IC device. In an implementation, the metal-containing film may be used for an electrode material for a dynamic random access memory (DRAM) device, a gate of a transistor, a resistor, an anti-magnetic film used for a hard device recording layer, a catalyst material for a solid polymer fuel cell, a conductive barrier film used for a metal wire, a dielectric film of a capacitor, a barrier metal film for liquid crystals, a member for thin-film solar cells, a member for semiconductor equipment, a nano-structure, or the like.

FIGS. 4A to 4J are cross-sectional views of stages in a method of manufacturing an IC device (refer to 300 in FIG. 4J) according to embodiments.

Figure 4A:
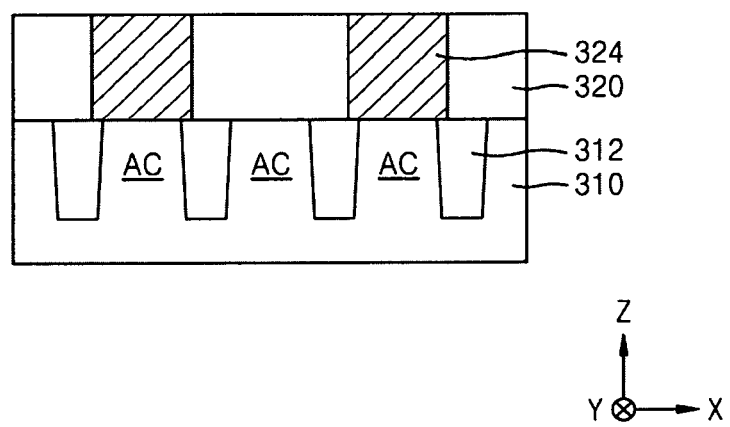
FIGS. 4A to 4J are cross-sectional views of stages in a method of manufacturing an IC device, according to embodiments.

Referring to FIG. 4A, an interlayer dielectric 320 may be formed on a substrate 310 including a plurality of active regions AC. Thereafter, a plurality of conductive regions 324 may be formed to pass through the interlayer dielectric 320 and be connected to a plurality of active regions AC.

The substrate 310 may include a semiconductor, e.g., silicon (Si) or germanium (Ge), or a compound semiconductor, e.g., silicon germanium (SiGe), silicon carbide (SiC), gallium arsenide (GaAs), indium arsenide (InAs), or indium phosphide (InP). The substrate 310 may include a conductive region, e.g., a doped well or a doped structure. The plurality of active regions AC may be defined by a plurality of device isolation regions 312 formed in the substrate 310. The device isolation regions 312 may include a silicon oxide film, a silicon nitride film, a silicon oxynitride film, or a combination thereof. The interlayer dielectric 320 may include a silicon oxide film. The plurality of conductive regions 324 may be connected to one terminal of a switching device (e.g., a field-effect transistor) formed on the substrate 310. The plurality of conductive regions 324 may include polysilicon, a metal, a conductive metal nitride, a metal silicide, or a combination thereof.

Figure 4B:
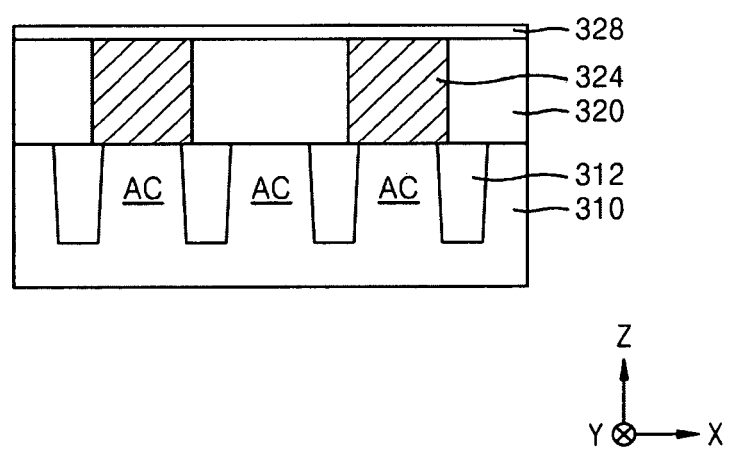

Referring to FIG. 4B, an insulating layer 328 covering the interlayer dielectric 320 and the plurality of conductive regions 324 may be formed. The insulating layer 328 may be used as an etch stop layer. The insulating layer 328 may include an insulating material having an etch selectivity with respect to the interlayer dielectric 320 and a mold film 330 (see FIG. 4C) which is formed in a subsequent process. The insulating layer 328 may include silicon nitride, silicon oxynitride, or a combination thereof.

Figure 4C:
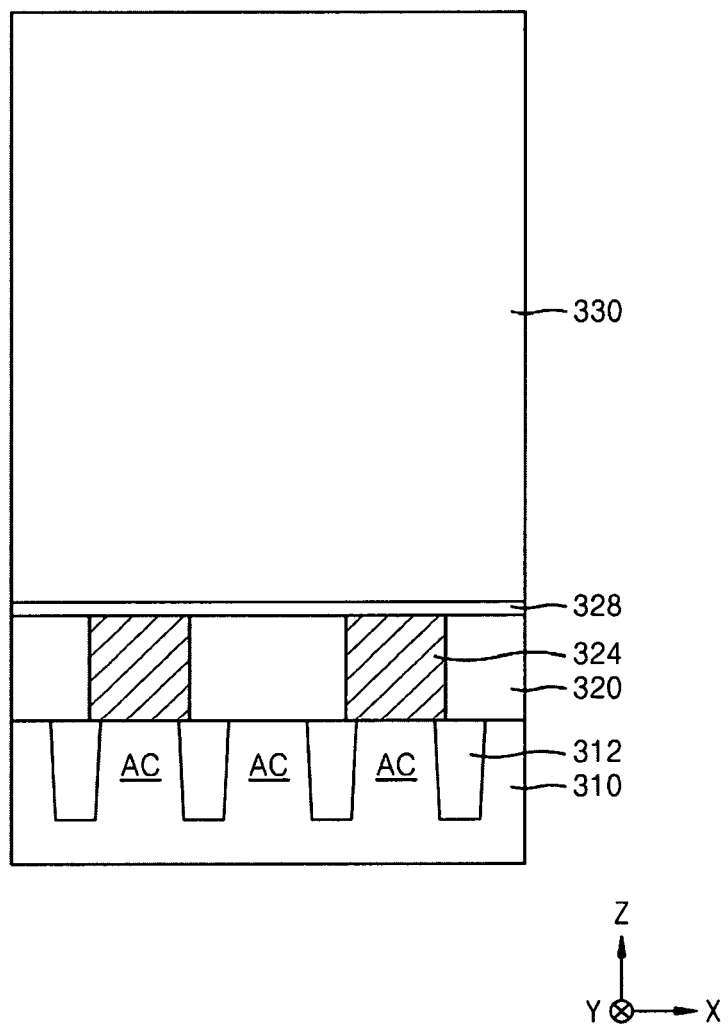

Referring to FIG. 4C, a mold film 330 may be formed on the insulating layer 328.

The mold film 330 may include an oxide film. In an implementation, the mold film 330 may include an oxide film such as borophosphosilicate glass (BPSG), phosphosilicate glass (PSG), and undoped silicate glass (USG). To form the mold film 130, a thermal CVD process or a plasma CVD process may be used. The mold film 330 may have a thickness of about 1,000 Å to about 20,000 Å. In an implementation, the mold film 330 may include a support film. The support film may include a material having an etch selectivity with respect to the mold film 330. The support film may include a material having a relatively low etch rate with respect to an etch atmosphere, e.g., with respect to an etchant including ammonium fluoride ($NH_4F$), hydrofluoric acid (HF), and water when the mold film 330 is removed in a subsequent process. In an implementation, the support film may include silicon nitride, silicon carbonitride, tantalum oxide, titanium oxide, or a combination thereof.

Figure 4D:
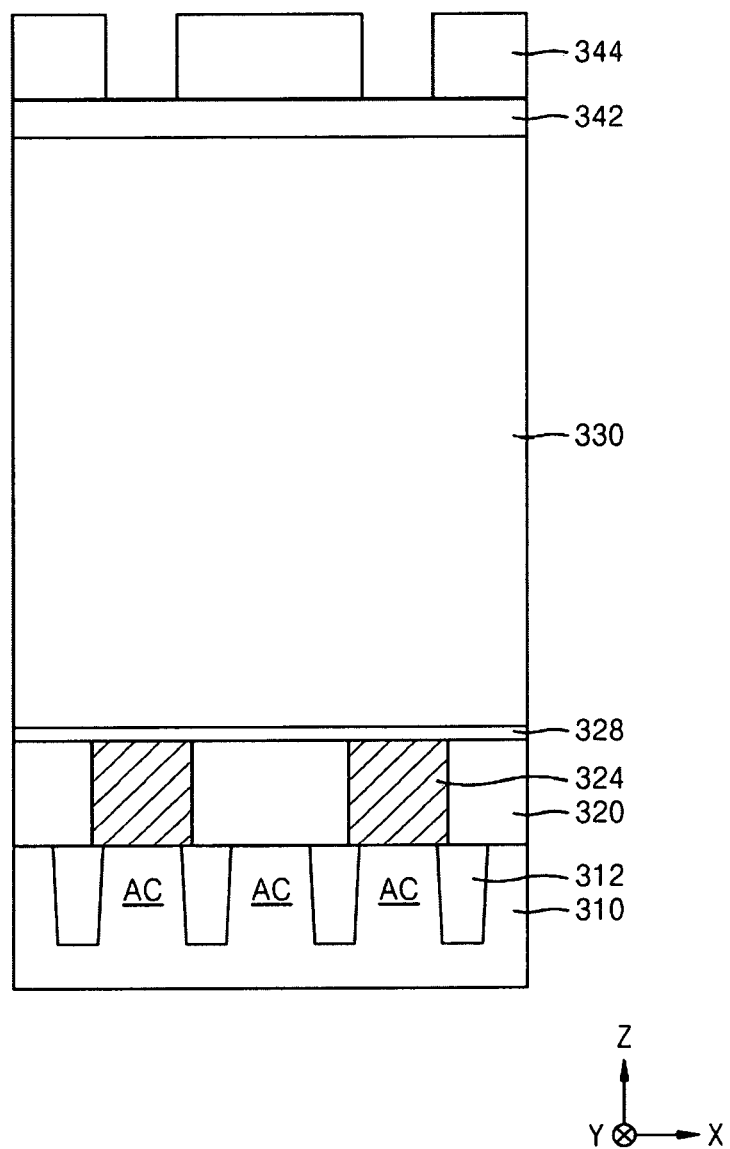

Referring to FIG. 4D, a sacrificial film 342 and a mask pattern 344 may be sequentially formed on the mold film 330.

The sacrificial film 342 may include an oxide film. The mask pattern 344 may include an oxide film, a nitride film, a polysilicon film, a photoresist film, or a combination thereof. A region in which a lower electrode of a capacitor will be formed may be defined by the mask pattern 344.

Figure 4E:
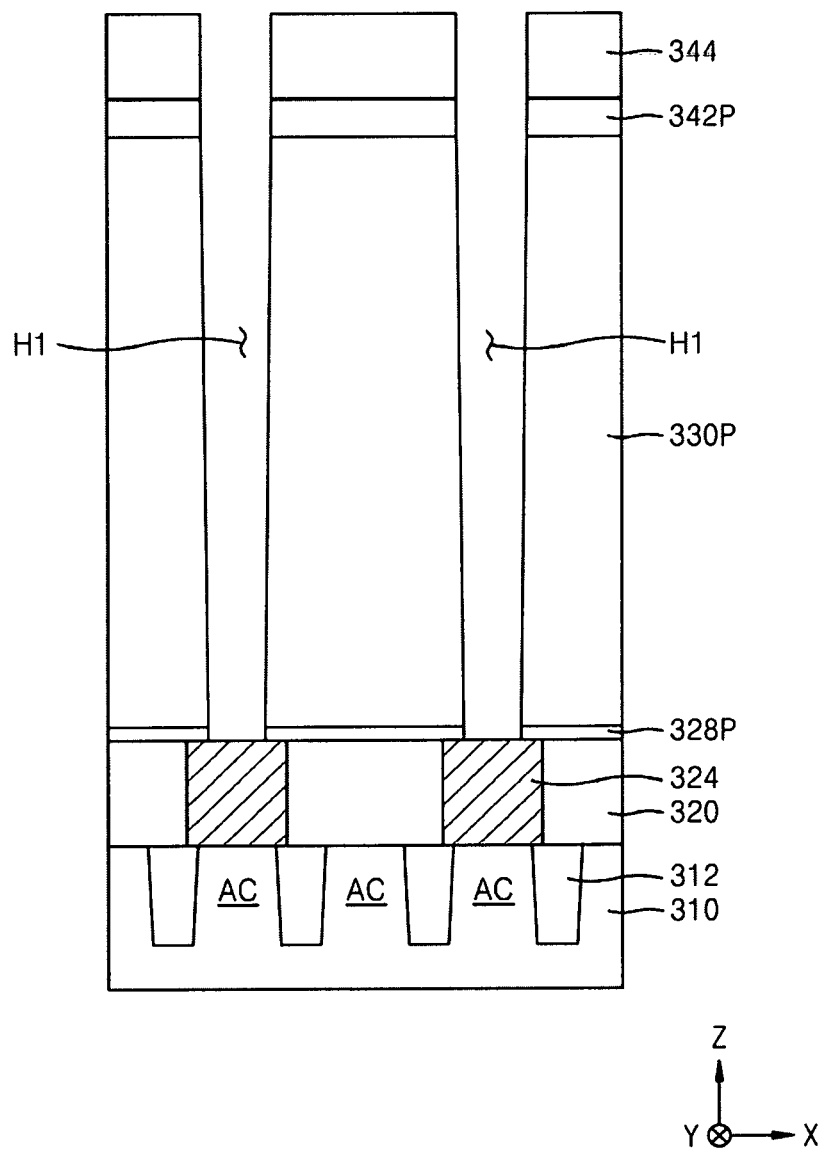

Referring to FIG. 4E, the sacrificial film 342 and the mold film 330 may be dry-etched using the mask pattern 344 as an etch mask and using the insulating layer 328 as an etch stop layer, thereby forming a sacrificial pattern 342P and a mold pattern 330P, which define a plurality of holes H1. Here, the insulating layer 328 may also be etched due to over-etch, whereby an insulating pattern 328P exposing the plurality of conductive regions 324 may be formed.

Figure 4F:
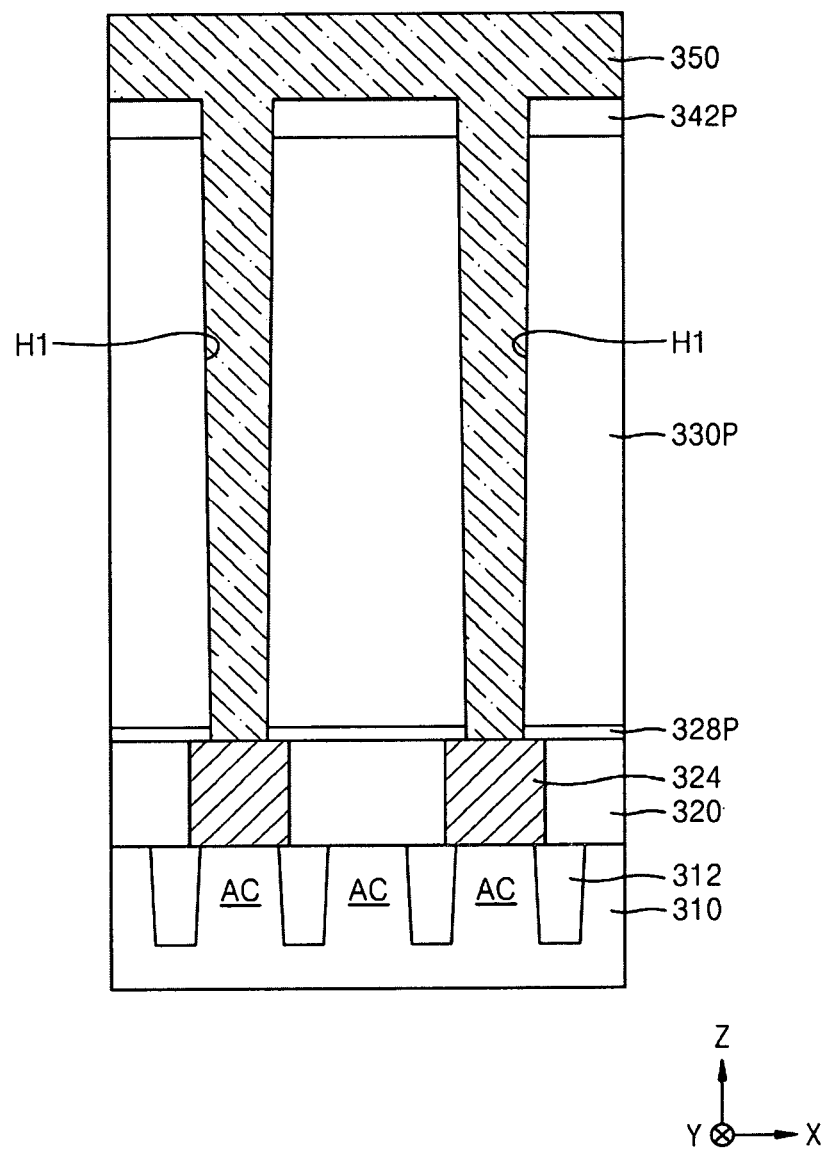

Referring to FIG. 4F, the mask pattern 344 may be removed from the resultant of FIG. 4E, followed by forming a conductive film 350 for forming lower electrodes, which fills the plurality of holes H1 and covers an exposed surface of the sacrificial pattern 342P.

The conductive film 350 for forming lower electrodes may include a doped semiconductor, a conductive metal nitride, a metal, a metal silicide, a conductive oxide, or a combination thereof. In an implementation, the conductive film 350 for forming lower electrodes may include NbN, TiN, TiAlN, TaN, TaAlN, W, WN, Ru, $RuO_2$, $SrRuO_3$, Ir, $IrO_2$, Pt, PtO, SRO($SrRuO_3$), BSRO(($Ba,Sr$)$RuO_3$), CRO ($CaRuO_3$), LSCo(($La,Sr$)$CoO_3$), or a combination thereof. To form the conductive film 350 for forming lower electrodes, a CVD, metal organic CVD (MOCVD), or ALD process may be used.

Figure 4G:
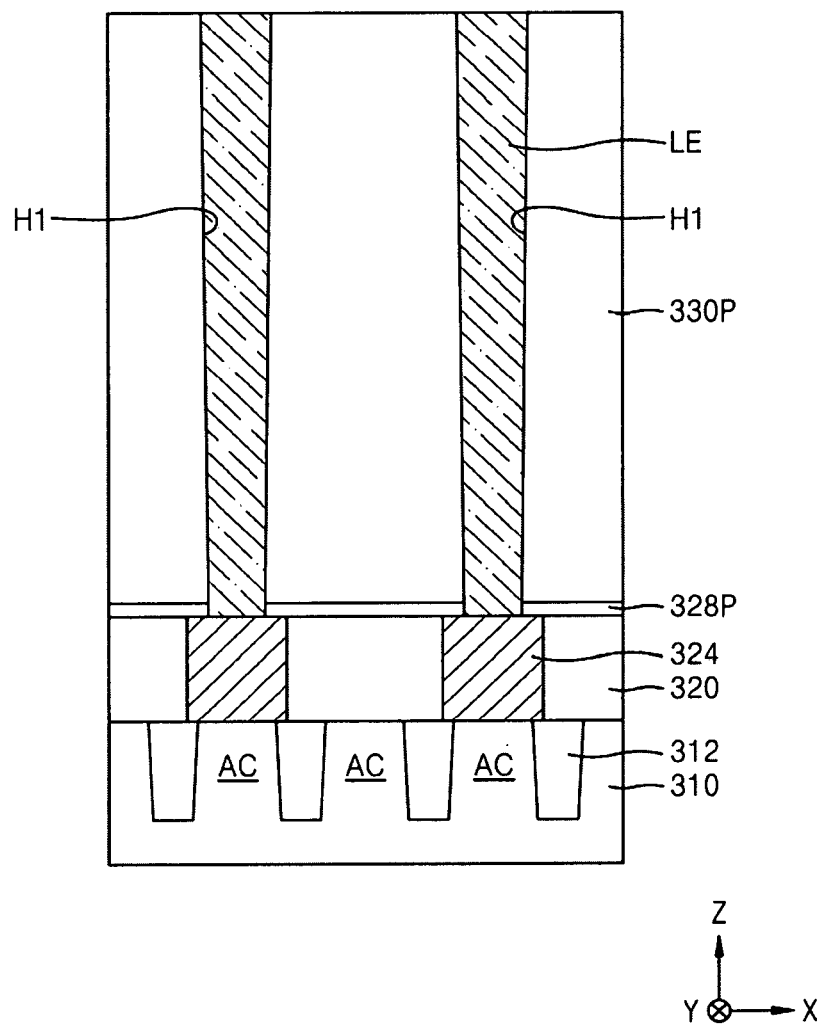

Referring to FIG. 4G, an upper side of the conductive film 350 for forming lower electrodes may be partially removed, and thus, the conductive film 350 for forming lower electrodes may be divided into a plurality of lower electrodes LE.

To form the plurality of lower electrodes LE, a portion of the upper side of the conductive film 350 for forming lower electrodes and the sacrificial pattern 342P (refer to FIG. 4F) may be removed by using an etchback or chemical mechanical polishing (CMP) process so that an upper surface of the mold pattern 330P is exposed.

Figure 4H:
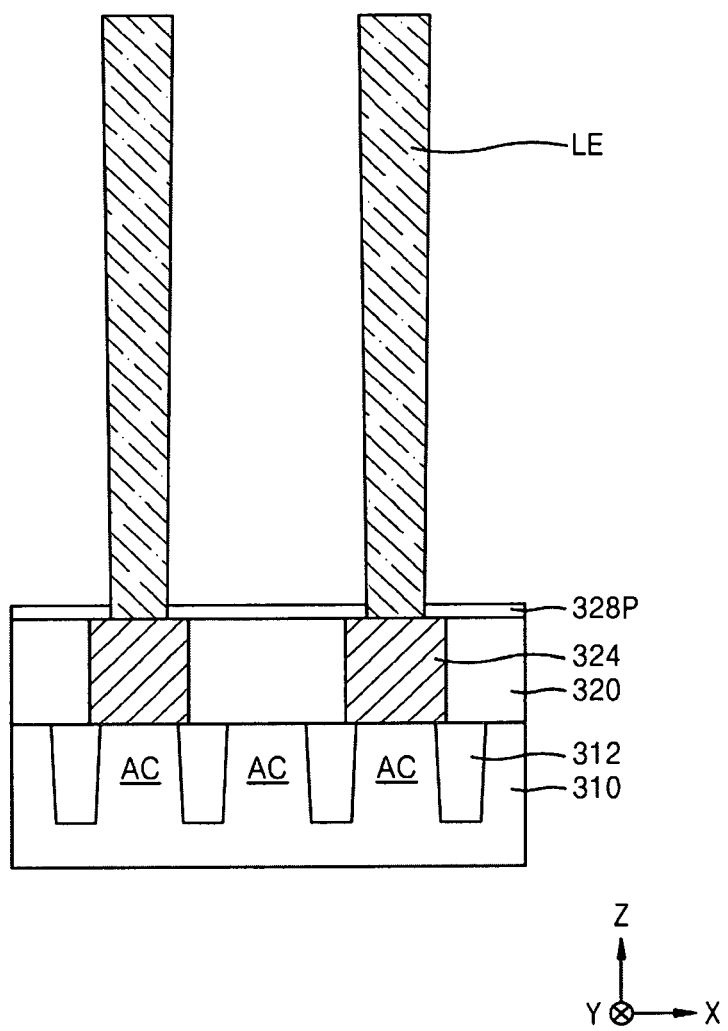

Referring to FIG. 4H, outer surfaces of the plurality of lower electrodes LE may be exposed by removing the mold pattern 330P from the resultant of FIG. 4G. The mold pattern 330P may be removed by a lift-off process using an etchant including ammonium fluoride ($NH_4F$), hydrofluoric acid (1F), and water.

Figure 4I:
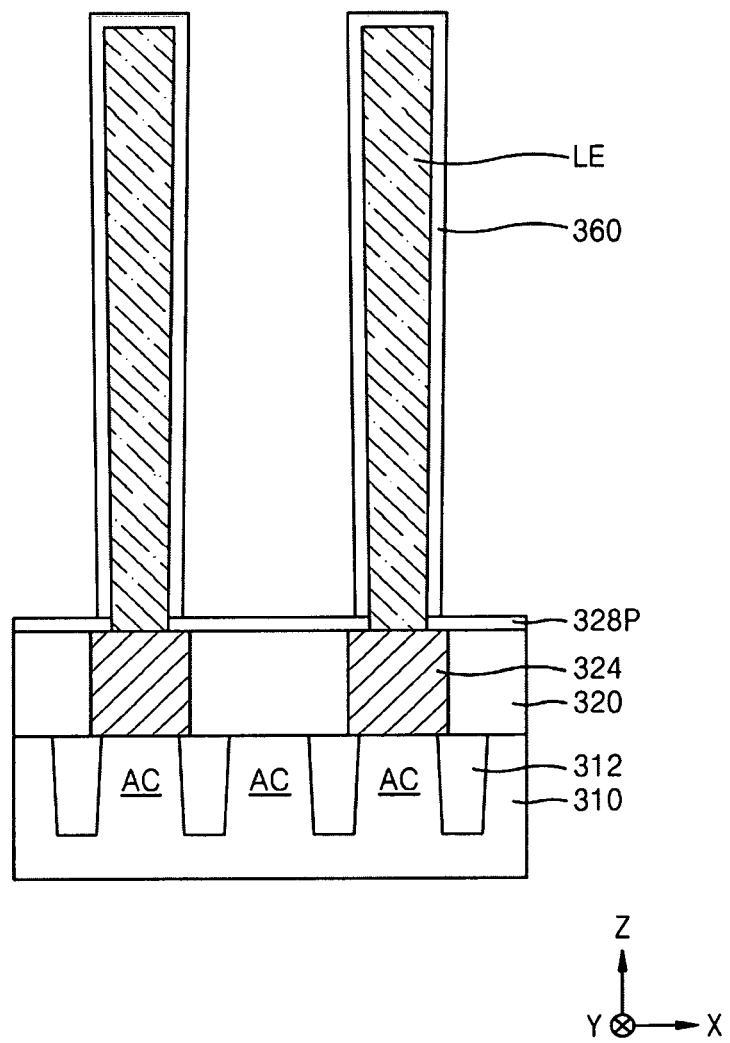

Referring to FIG. 4I, a dielectric film 360 may be formed on the plurality of lower electrodes LE.

The dielectric film 360 may conformally cover exposed surfaces of the plurality of lower electrodes LE.

The dielectric film 360 may be formed by an ALD process. In an implementation, to form at least a portion of the dielectric film 360, a metal-containing film may be formed using process P20 of FIG. 1 or the method described with reference to FIG. 2.

In an implementation, the dielectric film 360 may include a niobium nitride film, a niobium oxide film, a tantalum nitride film, a tantalum oxide film, a vanadium nitride film, or a vanadium oxide film.

In an implementation, the dielectric film 360 may not be formed on an insulating film, such as a silicon nitride film and a silicon oxide film, but may be selectively formed only on a metal-containing film. In an implementation, to form the dielectric film 360, process P20 of FIG. 1 or the processes described with reference to FIG. 2 may be performed. The dielectric film 360 may be formed using an organometallic compound having a structure of Formula (I). Thus, during the process of forming the dielectric film 360, a source gas obtained from the organometallic compound having the structure of Formula (I) may not be adsorbed on the insulating pattern 328P, but may be selectively adsorbed only on the surfaces of the plurality of lower electrodes LE containing a metal. As a result, the dielectric film 360 may be selectively formed only on the surfaces of the plurality of lower electrodes LE, from among the insulating pattern 328P and the plurality of lower electrodes LE (e.g., only being minimally or coincidentally formed on portions of the insulating pattern 328P immediately adjacent to the plurality of lower electrodes LE).

In an implementation, any one of the deposition systems 200A, 200B, 200C, and 200D shown in FIGS. 3A to 3D may be used to form the dielectric film 360. The dielectric film 360 may have a thickness of about 50 Å to about 150 Å.

Figure 4J:
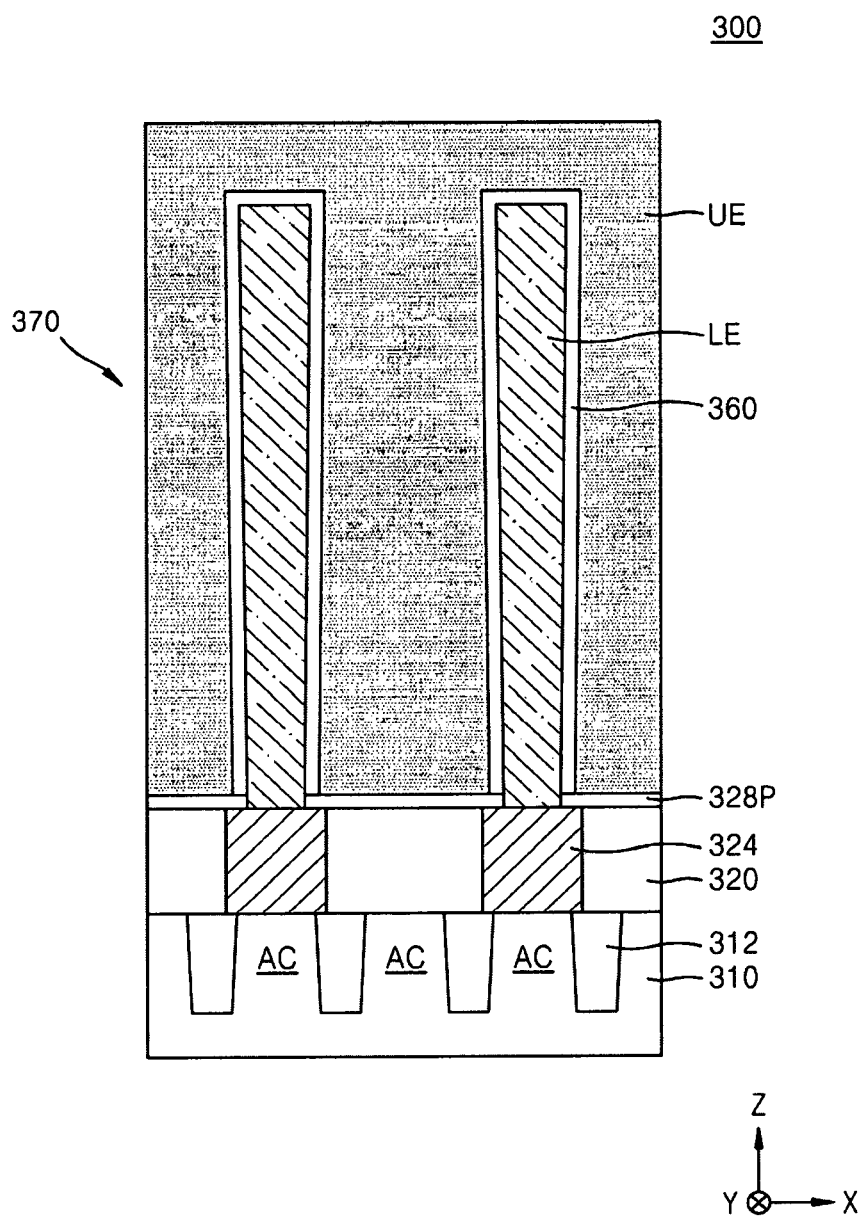

Referring to FIG. 4J, an upper electrode UE may be formed on the dielectric film 360 in the resultant structure of FIG. 4I. The lower electrode LE, the dielectric film 360, and the upper electrode UE may constitute a capacitor 370.

The upper electrode UE may be formed to contact a surface of the dielectric film 360 and an upper surface of the insulating pattern 328P. In an implementation, the upper electrode UE may include a doped semiconductor, a conductive metal nitride, a metal, a metal silicide, a conductive oxide, or a combination thereof. In an implementation, the upper electrode UE may include NbN, TiN, TiAlN, TaN, TaAlN, W, WN, Ru, $RuO_2$, $SrRuO_3$, Ir, $IrO_2$, Pt, PtO, SRO($SrRuO_3$), BSRO($(Ba,Sr)RuO_3$), CRO($CaRuO_3$), LSCo (($La,Sr)CoO_3$), or a combination thereof. The upper electrode UE may be formed using a CVD process, an MOCVD process, a physical vapor deposition (PVD) process, or an ALD process.

In an implementation, to form the upper electrode UE, a metal-containing film may be formed using process P20 of FIG. 1 or the method described with reference to FIG. 2. Any one of the deposition systems 200A, 200B, 200C, and 200D shown in FIGS. 3A to 3D may be used to form the upper electrode UE.

In an implementation, before the upper electrode UE is formed on the dielectric film 360 as described with reference to FIG. 4J, a process of forming an upper interface film to cover a surface of the dielectric film 360 may be further performed. In this case, the upper electrode UE may be formed on the upper interface film. The upper interface film may include a metal-containing film including niobium, tantalum, or vanadium. The metal-containing film included in the upper interface film may be formed using process P20 of FIG. 1 or the method described with reference to FIG. 2. Any one of the deposition systems 200A, 200B, 200C, and 200D shown in FIGS. 3A to 3D may be used to form the upper interface film.

In an implementation, in the method of manufacturing the IC device 300, each of the plurality of lower electrodes LE may have a pillar shape. In an implementation, each of the plurality of lower electrodes LE may have a cup-shaped sectional structure or a cylindrical sectional structure with a blocked bottom portion.

In the IC device 300 manufactured by using the method described with reference to FIGS. 4A to 4J, the capacitor 370 may include the lower electrodes LE having a 3D electrode structure. In order to compensate for a capacitance reduction due to a reduction in the design rule, an aspect ratio of the lower electrode LE having a 3D structure may be increased, and an ALD process may be used to form the dielectric film 360 having a good quality in a deep, narrow 3D space.

In the method of manufacturing the IC device 300 according to the embodiments, which is described with reference to FIGS. 4A to 4J, the dielectric film 360 may be formed using the organometallic compound of Formula (I), according to the embodiment, and thus, process stability may be improved. Furthermore, the dielectric film 360 may be selectively formed only on the surface of the lower electrode LE by using the organometallic compound having the structure of Formula (I), and thus, additional processes (e.g., an etching process) for removing unnecessary portions of the dielectric film 360 may be omitted after the dielectric film 360 is formed. Even when the dielectric film 360 is formed in a deep, narrow 3D space due to a high integration trend and miniaturization of the IC device 300, the dielectric film 360 may be partially formed only on the surface of the lower electrode LE, and thus, a process margin may be advantageously ensured during the process of manufacturing the IC device 300.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1

Synthesis of Intermediate 1 (cyclopentadienyl niobium tetrachloride)

109 g (1.00 mol) of chlorotrimethylsilane and 1 L of dehydrated THF were put in a 3 L 4-neck flask and stirred.

While maintaining the obtained resultant at a temperature of about 20° C., a 1 L (1.00 mol) sodium cyclopentadienide-THF solution was added dropwise thereto. After completion of the dropwise addition, the resultant was further stirred for 2 hours, and the obtained reactant was filtered, desolventized, and distilled to obtain 75.2 g of trimethylsilylcyclopentadiene (yield 54.4%).

A 2 L 4-neck flask was additionally prepared, and 135 g (0.500 mol) of $NbCl_5$ and 1 L of dehydrated dichloromethane were put into the 2 L 4-neck flask and cooled by stirring. 69.1 g (0.500 mol) of trimethylsilylcyclopentadiene, which was previously synthesized, was added dropwise into the additional 2 L 4-neck flask. Thereafter, the resultant solution was stirred for 1 hour at ambient temperature, an upper part of the reacted solution was removed, and the remaining solid was cleaned with hexane. The solid was heated and dried to obtain 138 g of a target material (yield 92.0%).

Synthesis Example 2

Synthesis of Intermediate 2
((methylcyclopentadienyl) niobium tetrachloride)

109 g (1.00 mol) of chlorotrimethylsilane and 1 L of dehydrated THF were put into a 2 L 4-neck flask and stirred. While maintaining the obtained resultant at a temperature of about 20° C., 1 L (1.00 mol) of a methyl cyclopentadienyl sodium-TiF solution was added dropwise thereto. After completion of the dropwise addition, the resultant was further stirred for 2 hours, and the obtained reactant was filtered, desolventized, and distilled to obtain 96.8 g of (methylcyclopentadienyl)trimethylsilane (yield 63.6%).

A 2 L 4-neck flask was additionally prepared, and 135 g (0.500 mol) of $NbCl_5$ and 1 L of dehydrated dichloromethane were put into the 2 L 4-neck flask and cooled by stirring. 76.2 g (0.500 mol) of (methyl cyclopentadienyl)trimethylsilane, which was previously synthesized, was added dropwise into the additional 2 L 4-neck flask. Thereafter, the resultant solution was stirred for 2 hours while being heated and refluxed, an upper portion of the reacted solution was removed, and the remaining solid was cleaned with hexane. The solid was heated and dried to obtain 136 g of target material (yield 86.4%).

Synthesis Example 3

Synthesis of Intermediate 3
((ethylcyclopentadienyl) niobium tetrachloride)

109 g (1.00 mol) of chlorotrimethylsilane and 1 L of dehydrated THF were put into a 2 L 4-neck flask and stirred. While maintaining the obtained resultant at a temperature of about 20° C., 1 L (1.00 mol) of an ethyl cyclopentadienyl sodium-TiF solution was added dropwise thereto. After completion of the dropwise addition, the resultant was further stirred for 2 hours, and the obtained reactant was filtered, desolventized, and distilled to obtain 124 g of (ethylcyclopentadienyl)trimethylsilane (yield 74.3%).

An additional 2 L 4-neck flask was prepared, and 135 g (0.500 mol) of $NbCl_5$ and 1 L of dehydrated dichloromethane were put into the 2 L 4-neck flask and cooled by stirring. 83.2 g (0.500 mol) of (ethyl cyclopentadienyl)trimethylsilane, which was previously synthesized, was added dropwise into the additional 2 L 4-neck flask. Thereafter, the resultant solution was stirred for 2 hours while being heated and refluxed, an upper portion of the reacted solution was removed, and the remaining solid was cleaned with hexane. The solid was heated and dried to obtain 118 g of target material (yield 72.1%).

Synthesis Example 4

Synthesis of Intermediate 4 (Cyclopentadienyl Tantalum Tetrachloride)

109 g (1.00 mol) of chlorotrimethylsilane and 1 L of dehydrated THF were put into a 3 L 4-neck flask and stirred. While maintaining the obtained resultant at a temperature of about 20° C., 1 L (1.00 mol) of a sodium cyclopentadienide-THF solution was added dropwise thereto. After completion of the dropwise addition, the resultant was further stirred for 2 hours, and the obtained reactant was filtered, desolventized, and distilled to obtain 75.2 g of trimethylsilylcyclopentadiene (yield 54.4%).

A 200 mL 4-neck flask was additionally prepared, and 17.9 g (50.0 mmol) of $TaCl_5$ and 100 mL of dehydrated dichloromethane was put into the 200 mL 4-neck flask and cooled by stirring. 6.91 g (50.0 mmol) of trimethylsilylcyclopentadiene, which was previously synthesized, was added dropwise into the 200 mL 4-neck flask. Thereafter, the resultant solution was stirred for 1 hour at ambient temperature, an upper portion of the reacted solution was removed, and the remaining solid was cleaned with hexane. The solid was heated and dried to obtain 18.6 g of target material (yield 95.9%).

Example 1

Synthesis of the Compound of Formula 7

1.00 g (3.70 mmol) of Intermediate 1 (the product synthesized in Synthesis Example 1) and 10 mL of dehydrated dichloromethane were added into a 100 mL 4-neck flask and cooled. Thereafter, while maintaining a solution temperature of about −30° C., 812 mg (11.1 mmol) of tert-butylamine was added dropwise thereto. After completion of the dropwise addition, the resultant was stirred for 5 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was added. While maintaining a solution temperature of about 10° C., 14.8 mL (7.40 mmol) of a 1,1,1,3,3,3-hexafluoro-2-propoxylithium-THF solution was added dropwise thereto. The obtained solution was stirred for 6 hours at ambient temperature and desolventized, and a target material was extracted from 20 mL of dehydrated hexane. Subsequently, the resultant was filtered, desolventized, and distilled to obtain 765 mg (yield 36.7%) of a target material.

(Analysis Values)

(1) Thermogravimetry-Differential Thermal Analysis (TG-DTA) Under Normal (e.g., Atmospheric) Pressure 50% mass reduction temperature: 166° C. (760 torr, an Ar flow rate of 100 mL/min, heating rate of 10° C./min)

(2) 1H-NMR (Heavy Benzene)

5.90 ppm (5H, singlet), 4.95 ppm (2H, sextet), 0.79 ppm (9H, singlet)

(3) Analysis of Elements (Theoretical Value)

C: 32.5% (32.0%), H: 3.1% (2.9%), F: 40.9% (40.5%), N: 2.9% (2.5%), Nb: 16.9% (16.5%)

Example 2

Synthesis of the Compound of Formula 19

1.00 g (3.70 mmol) of Intermediate 1 (the product synthesized in Synthesis Example 1) and 10 mL of dehydrated dichloromethane were added into a 100 mL 4-neck flask and cooled. Thereafter, while maintaining a solution temperature of about −30° C., 812 mg (11.1 mmol) of sec-butylamine was added dropwise thereto. After completion of the dropwise addition, the resultant was stirred for 6 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 14.8 mL (7.40 mmol) of a lithium per-fluoro-tert-butoxide-THF solution was added dropwise thereto. The obtained solution was stirred for 18 hours at room temperature and desolventized, and a target material was extracted from 20 mL of dehydrated hexane. Subsequently, the resultant was filtered, desolventized, and distilled to obtain 1.21 g (yield 46.7%) of a target material.

(Analysis Values)

(1) TG-DTA Under Normal Pressure

50% mass reduction temperature: 177° C. (760 torr, an Ar flow rate of 100 mL/min, heating rate of 10° C./min)

(2) 1H-NMR (Heavy Benzene)

6.02 ppm (5H, singlet), 3.38 ppm (1H, sextet), 1.33 ppm (1H, multiplet), 1.04 ppm (1H, multiplet), 0.82 ppm (3H, doublet), 0.66 ppm (3H, triplet)

(3) Analysis of Elements (Theoretical Value)

C: 30.3% (29.2%), H: 2.1% (2.0%), F: 49.2% (48.9%), N: 2.2% (2.0%), Nb: 13.6% (13.3%)

Example 3

Synthesis of the Compound of Formula 20

1.16 g (3.70 mmol) of Intermediate 2 (the product synthesized in Synthesis Example 2) and 10 mL of dehydrated dichloromethane were added into a 100 mL 4-neck flask and cooled. Thereafter, while maintaining a solution temperature of about −30° C., 812 mg (11.1 mmol) of sec-butylamine was added dropwise thereto. After completion of the dropwise addition, the resultant was stirred for 6 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 14.8 mL (7.40 mmol) of a lithium per-fluoro-tert-butoxide-THF solution was added dropwise thereto. The obtained solution was stirred for 4 hours at ambient temperature and desolventized, and a target material was extracted from 20 mL of dehydrated hexane. Subsequently, the resultant was filtered, desolventized, and distilled to obtain 863 mg (yield 32.7%) of a target material.

(Analysis Values)

(1) TG-DTA Under Normal Pressure

50% mass reduction temperature: 180° C. (760 torr, an Ar flow rate of 100 mL/min, heating rate of 10° C./min)

(2) 1H-NMR (Heavy Benzene)

6.07 ppm (2H, multiplet), 5.74 ppm (2H, multiplet), 3.43 ppm (1H, sextet), 1.81 ppm (3H, singlet), 1.38 ppm (1H, multiplet), 1.08 ppm (1H, multiplet), 0.84 ppm (3H, doublet), 0.67 ppm (3H, triplet)

(3) Analysis of Elements (Theoretical Value)

C: 30.9% (30.3%), H: 2.8% (2.3%), F: 48.6% (48.0%), N: 2.3% (2.0%) Nb: 13.4% (13.0%)

Example 4

Synthesis of the Compound of Formula 22

1.00 g (3.70 mmol) of Intermediate 1 (the product synthesized in Synthesis Example 1) and 10 mL of dehydrated dichloromethane were added into a 100 mL 4-neck flask and cooled. Thereafter, while maintaining a solution temperature of −30° C., 812 mg (11.1 mmol) of tert-butylamine was added dropwise thereto. After completion of the dropwise addition, the resultant was stirred for 6 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 14.8 mL (7.40 mmol) of lithium per-fluoro-tert-butoxide-THE solution was added dropwise thereto. The obtained solution was stirred for 17 hours at ambient temperature and desolventized, and a target material was extracted from 20 mL of dehydrated hexane. Subsequently, the resultant was filtered, desolventized, and distilled to obtain 1.36 g (yield 52.7%) of a target material.

(Analysis Values)

(1) TG-DTA Under Normal Pressure

50% mass reduction temperature: 172° C. (760 torr, an Ar flow rate of 100 mL/min, heating rate of 10° C./min)

(2) 1H-NMR (Heavy Benzene)

6.04 ppm (5H, singlet), 0.91 ppm (9H, singlet)

(3) Analysis of Elements (Theoretical Value)

C: 30.1%(29.2%), H: 2.2%(2.0%), F: 48.4%(48.9%), N: 2.2%(2.0%) Nb: 13.8% (13.3%)

Example 5

Synthesis of the Compound of Formula 24

1.21 g (3.70 mmol) of Intermediate 3 (the product synthesized in Synthesis Example 3) and 10 mL of dehydrated dichloromethane were added into a 100 mL 4-neck flask and cooled. Thereafter, while maintaining a solution temperature of about −30° C., 812 mg (11.1 mmol) of tert-butylamine was added dropwise thereto. After completion of the dropwise addition, the resultant was stirred for 6 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 14.8 mL (7.40 mmol) of a lithium per-fluoro-tert-butoxide-THF solution was added dropwise thereto. The obtained solution was stirred for 6 hours at ambient temperature and desolventized, and a target material was extracted from 20 mL of dehydrated hexane. Subsequently, the resultant was filtered, desolventized, and distilled to obtain 710 mg (yield 26.4%) of a target material.

(Analysis Values)

(1) TG-DTA Under Normal Pressure

50% mass reduction temperature: 184° C. (760 torr, an Ar flow rate of 100 mL/min, heating rate of 10° C./min)

(2) 1H-NMR (Heavy Benzene)

6.15 ppm (2H, multiplet), 5.83 ppm (2H, multiplet), 2.28 ppm (2H, quartet), 0.96 ppm (9H, singlet), 0.95 ppm (3H, triplet)

(3) Analysis of Elements (Theoretical Value)
C: 31.9% (31.4%), H: 2.5% (2.5%), F: 47.6% (47.0%), N: 2.0% (1.9%), Nb: 12.9% (12.8%)

Example 6

Synthesis of the Compound of Formula 25

1.00 g (3.70 mmol) of Intermediate 1 (the product synthesized in Synthesis Example 1) and 10 mL of dehydrated dichloromethane were added into a 100 mL 4-neck flask and cooled. Thereafter, while maintaining a solution temperature of about −30° C., 968 mg (11.1 mmol) of tert-amylamine was added dropwise thereto. After completion of the dropwise addition, the resultant was stirred for 6 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 14.8 mL (7.40 mmol) of a lithium per-fluoro-tert-butoxide-THF solution was added dropwise thereto. The obtained solution was stirred for 17 hours at ambient temperature and desolventized, and a target material was extracted from 20 mL of dehydrated hexane. Subsequently, the resultant was filtered, desolventized, and distilled to obtain 1.52 g (yield 57.5%) of a target material.
(Analysis Values)
(1) TG-DTA Under Normal Pressure
50% mass reduction temperature: 178° C. (760 torr, an Ar flow rate of 100 mL/min, a heating rate of 10° C./min)
(2) 1H-NMR (Heavy Benzene)
6.08 ppm (5H, singlet), 1.24 ppm (2H, quartet), 0.89 ppm (6H, singlet), 0.70 ppm (3H, triplet)
(3) Analysis of Elements (Theoretical Value)
C: 30.7% (30.3%), H: 2.5% (2.3%), F: 48.4% (48.0%), N: 2.2% (2.0%), Nb: 13.4% (13.0%)

Example 7

Synthesis of the Compound of Formula 28

1.00 g (3.70 mmol) of Intermediate 1 (the product synthesized in Synthesis Example 1) and 10 mL of dehydrated dichloromethane were added into a 100 mL 4-neck flask and cooled. Thereafter, while maintaining a solution temperature of about −30° C., 1.43 g (11.1 mmol) of 1,1,3,3-tetramethylbutylamine was added dropwise thereto. After completion of the dropwise addition, the resultant was stirred for 6 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 14.8 mL (7.40 mmol) of a lithium per-fluoro-tert-butoxide-THF solution was added dropwise thereto. The obtained solution was stirred for 18 hours at ambient temperature and desolventized, and a target material was extracted from 20 mL of dehydrated hexane. Subsequently, the resultant was filtered, desolventized, and distilled to obtain 1.45 g (yield 51.8%) of a target material.
(Analysis Values)
(1) TG-DTA Under Normal Pressure
50% mass reduction temperature: 197° C. (760 torr, an Ar flow rate of 100 mL/min, a heating rate of 10° C./min)
(2) 1H-NMR (Heavy Benzene)
6.11 ppm (5H, singlet), 1.48 ppm (2H, singlet), 1.08 ppm (6H, singlet), 0.87 ppm (9H, singlet)

(3) Analysis of Elements (Theoretical Value)
C: 34.0% (33.4%), H: 3.2% (2.9%), F: 45.6% (45.3%), N: 2.1% (1.9%), Nb: 12.6% (12.3%)

Example 8

Synthesis of the Compound of Formula 12

1.21 g (3.70 mmol) of Intermediate 3 (the product synthesized in Synthesis Example 3) and 10 mL of dehydrated dichloromethane were added into a 100 mL 4-neck flask and cooled. Thereafter, while maintaining a solution temperature of about −30° C., 968 mg (11.1 mmol) of tert-amylamine was added dropwise thereto. After completion of the dropwise addition, the resultant was stirred for 4 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 14.8 mL (7.40 mmol) of a 1,1,1,3,3,3-hexafluoro-2-propoxylithium-THF solution was added dropwise thereto. The obtained solution was stirred for 3 hours at ambient temperature and desolventized, and a target material was extracted from 20 mL of dehydrated hexane. Subsequently, the resultant was filtered, desolventized, and distilled to obtain 719 mg (yield 32.1%) of a target material.
(Analysis Values)
(1) TG-DTA Under Normal Pressure
50% mass reduction temperature: 188° C. (760 torr, an Ar flow rate of 100 mL/min, a heating rate of 10° C./min)
(2) 1H-NMR (Heavy Benzene)
6.08 ppm (2H, multiplet), 5.68 ppm (2H, multiplet), 5.04 ppm (2H, septet), 2.28 ppm (2H, quartet), 1.11 ppm (2H, quartet), 0.94 ppm (4H, triplet), 0.83 ppm (6H, singlet), 0.67 ppm (3H, triplet)
(3) Analysis of Elements (Theoretical Value)
C: 36.0% (35.7%), H: 3.8% (3.7%), F: 38.0% (37.7%), N: 2.5% (2.3%), Nb: 15.7% (15.4%)

Example 9

Synthesis of the Compound of Formula 53

1.00 g (3.70 mmol) of Intermediate 1 (the product synthesized in Synthesis Example 1) and 10 mL of dehydrated dichloromethane were added into a 100 mL 4-neck flask and cooled. Thereafter, while maintaining a solution temperature of about −30° C., 812 mg (11.1 mmol) of sec-butylamine was added dropwise thereto. After completion of the dropwise addition, the resultant was stirred for 6 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 7.4 mL (3.70 mmol) of a lithium tert-butoxide-THF solution was added dropwise thereto. The resultant was heated to ambient temperature and then stirred for 3 hours at room temperature. The reacted solution was cooled again to a temperature of about 10° C., and 7.4 mL (3.70 mmol) of a lithium per-fluoro-tert-butoxide-THF solution was then added dropwise. The obtained solution was stirred for 18 hours at room temperature and desolventized, and a target material was extracted from 20 mL of dehydrated hexane. Subsequently, the resultant was filtered, desolventized, and distilled to obtain 1.23 g (yield 61.7%) of a target material.

(Analysis Values)
(1) TG-DTA Under Normal Pressure
50% mass reduction temperature: 181° C. (760 torr, an Ar flow rate of 100 mL/min, a heating rate of 10° C./min)
(2) 1H-NMR (Heavy Benzene)
6.08 ppm (5H, singlet), 3.45 ppm (1H, sextet), 1.46 ppm (1H, multiplet), 1.23 ppm (9H, singlet), 1.19 ppm (1H, multiplet), 0.96 ppm (3H, doublet), 0.77 ppm (3H, triplet)
(3) Analysis of Elements (Theoretical Value)
C: 38.3% (38.0%), H: 4.6% (4.3%), F: 32.0% (31.8%), N: 3.0% (2.6%), Nb: 17.5% (17.3%)

Example 10

Synthesis of the Compound of Formula 89
1.44 g (3.70 mmol) Intermediate 4 (the product synthesized in Synthesis Example 4) and 10 mL of dehydrated dichloromethane were added into a 100 mL 4-neck flask and cooled. Thereafter, while maintaining a solution temperature of about −30° C., 812 mg (11.1 mmol) of sec-butylamine was added dropwise thereto. After completion of the dropwise addition, the resultant was stirred for 5 hours while being heated and refluxed. The obtained reacted solution was cooled to ambient temperature and then filtered. The filtrate was obtained in an additionally prepared 100 mL 3-neck flask and desolventized, and 10 mL of dehydrated toluene was then added. While maintaining a solution temperature of about 10° C., 14.8 mL (7.40 mmol) of a lithium per-fluoro-tert-butoxide-THF solution was added dropwise thereto. The obtained solution was stirred for 19 hours at ambient temperature and desolventized, and a target material was extracted from 20 mL of dehydrated hexane. Subsequently, the resultant was filtered, desolventized, and distilled to obtain 1.81 g (yield 62.1%) of a target material.
(Analysis Values)
(1) TG-DTA Under Normal Pressure
50% mass reduction temperature: 171° C. (760 torr, an Ar flow rate of 100 mL/min, a heating rate of 10° C./min)
(2) 1H-NMR (Heavy Benzene)
5.98 ppm (5H, singlet), 4.04 ppm (1H, sextet), 1.36 ppm (1H, multiplet), 1.10 ppm (1H, multiplet), 0.88 ppm (3H, doublet), 0.74 ppm (3H, triplet)
(3) Analysis of Elements (Theoretical Value)
C: 26.3% (25.9%), H: 2.1% (1.8%), F: 43.6% (43.4%), N: 2.2% (1.8%), Ta: 16.9% (16.5%)

Examples 1 to 7 and Comparative Examples 1 to 3

Properties of Compounds
A 50% mass reduction temperature T1 (under normal pressure and TG-DTA), a thermal decomposition initiation temperature T2, a phase (at 20° C.), and a melting point of each of the compounds of Formulae 7, 19, 20, 22, 24, 25, and 28, which were obtained in Examples 1 to 7, and the following comparative compounds 1 to 3 were determined as follows and shown in Table 1.

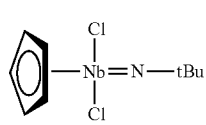

Comparative compound 1

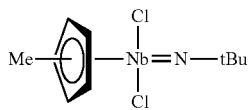

Comparative compound 2

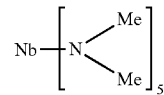

Comparative compound 3

(1) TG-DTA Under Normal Pressure
Under conditions of normal (e.g., atmospheric) pressure, an Ar flow rate of 100 mL/min, a heating rate of 10° C./min, and a scanning temperature range of about 30° C. to about 600° C., a 50% mass reduction temperature T1 of each of the compounds of Formulae 7, 19, 20, 22, 24, 25, and 28, which were obtained in Examples 1 to 7, and the comparative compounds 1 to 3 was measured using a TG-DTA technique, and measurement results thereof are shown in Table 1.
(2) Thermal Stability
A thermal decomposition initiation temperature T2 of each of the compounds of Formulae 7, 19, 20, 22, 24, 25, and 28, which were obtained in Examples 1 to 7, and the comparative compounds 1 to 3, was measured using a differential scanning calorimetry (DSC) system, and measurement results thereof are shown in Table 1. A compound having a high thermal decomposition initiation temperature T2 is difficult to thermally decompose and suitable as a source for forming a thin film.
(3) Melting Points of Compounds
Results obtained by visually observing phases of the compounds of Formulae 7, 19, 20, 22, 24, 25, and 28, which were obtained in Examples 1 to 7, and the comparative compounds 1 to 3 at a temperature of about 20° C. are shown in Table 1. Table 1 also shows results obtained by measuring melting points of compounds that are solid at the temperature of about 20° C.

TABLE 1

| Example | Compound | T1 [° C.] | T2 [° C.] | at 20° C. Phase | Melting point [° C.] |
|---|---|---|---|---|---|
| Example 1 | Formula 7 | 166 | 300 | Solid | <100 |
| Example 2 | Formula 19 | 177 | 311 | Liquid | — |
| Example 3 | Formula 20 | 180 | 294 | Liquid | — |
| Example 4 | Formula 22 | 172 | 328 | Solid | <100 |
| Example 5 | Formula 24 | 184 | 326 | Solid | <100 |
| Example 6 | Formula 25 | 178 | 329 | Solid | <100 |
| Example 7 | Formula 28 | 197 | 335 | Liquid | — |
| Comparative Example 1 | Comparative compound 1 | 216 | 291 | Solid | <100 |
| Comparative Example 2 | Comparative compound 2 | 214 | 280 | Solid | <100 |
| Comparative Example 3 | Comparative compound 3 | 178 | 126 | Solid | <100 |

From the results of Table 1, it may be seen that the 50% mass reduction temperature T1 (under normal pressure and TG-DTA) of each of the compounds of Formulae 7, 19, 20, 22, 24, 25, and 28, which were obtained in Examples 1 to 7, was lower than that of each of the comparative compounds 1 and 2, and each of the compounds of Formulae 7, 19, 20, 22, 24, 25, and 28 had a relatively high vapor pressure. In addition, it may be seen that the thermal decomposition initiation temperature T2 of each of the compounds of Formulae 7, 19, 20, 22, 24, 25, and 28, which were obtained in Examples 1 to 7, was much higher than that of the comparative compound 3 and each of the compounds of Formulae 7, 19, 20, 22, 24, 25, and 28 had high thermal stability. The thermal decomposition initiation temperature T2 of each of the compounds of Formulae 19, 22, 24, 25, and 28 was higher than about 310° C., and thus, the compounds of Formulae 19, 22, 24, 25, and 28 were confirmed to be excellent in thermal stability. In addition, it may be seen that the compounds of Formulae 19, 20, and 28 are compounds having especially low melting points, which are liquids at a temperature of about 20° C.

Examples 8 to 15 and Comparative Examples 4 to 6

Formation of a Metal Nitride Film

A niobium nitride film was formed on a silicon substrate through an ALD process by using each of the compounds of Formulae 2, 12, 19, 20, 22, 24, 25, and 28, which were obtained in Examples 1 to 8, and the comparative compounds 1 to 3 as a source and using the deposition system of FIG. 3A. Conditions of an ALD process for forming the niobium nitride film were as follows.

<Conditions>

Reaction temperature (substrate temperature): 350° C.

Reactive gas: ammonia gas

<Process>

One cycle including a series of processes (1) to (4) described below was repeated 150 times under the above-described conditions.

Process (1): Vapor generated by vaporizing a source under conditions where a source container was heated to a temperature of about 90° C. and maintained under inner pressure of about 100 Pa was introduced into a chamber, and a niobium nitride film was deposited for about 30 seconds in the chamber, which was maintained under pressure of about 100 Pa.

Process (2): An argon (Ar) purge process was performed for about 10 seconds to remove unreacted sources from the chamber.

Process (3): A reactive gas was supplied into the chamber to cause a reaction for about 30 seconds under pressure of about 100 Pa.

Process (4): An argon purge gas was performed for about 10 seconds to remove unreacted sources from the chamber.

A thickness of each of thin films obtained using the processes (1) to (4) was measured using an X-ray reflectivity technique, and a compound of each of the obtained thin films was confirmed using an X-ray diffraction technique. A carbon content of each of the obtained thin films was measured using an X-ray photoelectron spectroscopy (XPS) technique, and measurement results thereof are shown in Table 2.

TABLE 2

| Example | Compound | Thickness of thin film (nm) | Compound of thin film | Carbon content |
|---|---|---|---|---|
| Example 8 | Formula 7 | 6 | niobium nitride | Not detected |
| Example 9 | Formula 12 | 7 | niobium nitride | Not detected |
| Example 10 | Formula 19 | 9 | niobium nitride | Not detected |
| Example 11 | Formula 20 | 8 | niobium nitride | Not detected |
| Example 12 | Formula 22 | 6 | niobium nitride | Not detected |
| Example 13 | Formula 24 | 6 | niobium nitride | Not detected |
| Example 14 | Formula 25 | 6 | niobium nitride | Not detected |
| Example 15 | Formula 28 | 10 | niobium nitride | Not detected |
| Comparative Example 4 | Comparative compound 1 | 3 | niobium nitride | 8 at % |
| Comparative Example 5 | Comparative compound 2 | 3 | niobium nitride | 10 at % |
| Comparative Example 6 | Comparative compound 3 | 4 | niobium nitride | 15 at % |

As may be seen from the results of Table 2, a carbon content of each of niobium nitride thin films obtained using the comparative compounds 1 to 3, from among the thin films obtained using the ALD process, was 8 atomic percent (at %) or more. In contrast, a carbon content of each of the niobium nitride thin films obtained using the compounds of Formulae 2, 12, 19, 20, 22, 24, 25, and 28 was about 0.1 at % or less, which was a detection limit. Thus, the niobium nitride thin films obtained using the compounds of Formulae 2, 12, 19, 20, 22, 24, 25, and 28 were confirmed to be thin films of good quality. In addition, as a result of estimating thicknesses of the thin films obtained after 150 cycles of the ALD process, each of the thin films obtained using the comparative compounds 1 to 3 was about 4 nm or less, while each of the thin films obtained using the compounds of Formulae 2, 12, 19, 20, 22, 24, 25, and 28 was about 6 nm or more. Thus, it may be seen that the productivity of a thin film forming process was excellent.

Examples 16 to 23 and Comparative Examples 7 to 9

Formation of a Metal Oxide Film

Next, a niobium oxide film was formed on a silicon substrate through an ALD process by using each of the compounds of Formulae 2, 12, 19, 20, 22, 24, 25, and 28, which were obtained in Examples 1 to 8, and the comparative compounds 1 to 3 as a source and using the deposition system of FIG. 3A. Conditions of an ALD process for forming the niobium oxide film were as follows.

<Conditions>

Reaction temperature (substrate temperature): 300° C.

Reactive gas: ozone gas

<Process>

One cycle including a series of processes (1) to (4) described below was repeated 150 times under the above-described conditions.

Process (1): Vapor generated by vaporizing a source under conditions where a source container was heated to a temperature of about 90° C. and maintained under inner pressure of about 100 Pa was introduced into a chamber, and a niobium nitride film was deposited for about 30 seconds in the chamber, which was maintained under pressure of about 100 Pa.

Process (2): An argon (Ar) purge process was performed for about 10 seconds to remove unreacted sources from the chamber.

Process (3): A reactive gas was supplied into the chamber to cause a reaction for about 30 seconds under pressure of about 100 Pa.

Process (4): An argon purge gas was performed for about 10 seconds to remove unreacted sources from the chamber.

A thickness of each of thin films obtained using the processes (1) to (4) was measured using an X-ray reflectivity technique, and a compound of each of the obtained thin films was confirmed using an X-ray diffraction technique. A carbon content of each of the obtained thin films was measured using an X-ray photoelectron spectroscopy (XPS) technique, and measurement results thereof are shown in Table 3.

TABLE 3

| Example | Compound | Thickness of thin film (nm) | Compound of thin film | Carbon content |
|---|---|---|---|---|
| Example 16 | Formula 7 | 5 | niobium oxide | Not detected |
| Example 17 | Formula 12 | 6 | niobium oxide | Not detected |
| Example 18 | Formula 19 | 7 | niobium oxide | Not detected |
| Example 19 | Formula 20 | 6 | niobium oxide | Not detected |
| Example 20 | Formula 22 | 5 | niobium oxide | Not detected |
| Example 21 | Formula 24 | 5 | niobium oxide | Not detected |
| Example 22 | Formula 25 | 5 | niobium oxide | Not detected |
| Example 23 | Formula 28 | 8 | niobium oxide | Not detected |
| Comparative Example 7 | Comparative compound 1 | 2 | niobium oxide | 7 at % |
| Comparative Example 8 | Comparative compound 2 | 2 | niobium oxide | 8 at % |
| Comparative Example 9 | Comparative compound 3 | 3 | niobium oxide | 12 at % |

As may be seen from the results of Table 3, a carbon content of each of niobium oxide thin films obtained using the comparative compounds 1 to 3, from among the thin films obtained using the ALD process, was 7 at % or more. In contrast, a carbon content of each of the niobium oxide thin films obtained using the compounds of Formulae 2, 12, 19, 20, 22, 24, 25, and 28 was about 0.1 at % or less, which was a detection limit. Thus, the niobium oxide thin films obtained using the compounds of Formulae 2, 12, 19, 20, 22, 24, 25, and 28 were confirmed to be thin films of good quality. In addition, as a result of estimating thicknesses of the thin films obtained after 150 cycles of the ALD process, each of the thin films obtained using the comparative compounds 1 to 3 was about 3 nm or less, while each of the thin films obtained using the compounds of Formulae 2, 12, 19, 20, 22, 24, 25, and 28 was about 5.0 nm or more. Thus, it may be seen that the productivity of a thin film forming process was excellent.

As can be seen from the Examples, the organometallic compounds according to the embodiments may have low melting points and high vapor pressures, and may help increase the productivity of thin-film forming processes when the organometallic compounds are used as sources in an ALD process or a CVD process for forming thin films.

By way of summation and review, source compounds for forming metal-containing films, which may provide excellent gap-fill characteristics and step coverage characteristics during the formation of a metal-containing film for the manufacture of an IC device, and which are easy to handle and thus advantageous in terms of process stability and mass productivity, have been considered.

One or more embodiments may provide an organometallic compound including niobium, tantalum, or vanadium as a metal.

One or more embodiments may provide an organometallic compound, which may be used as a source compound capable of providing excellent thermal stability, process stability, and mass productivity during the formation of a metal-containing film required for the manufacture of an integrated circuit (IC) device.

One or more embodiments may provide a method of manufacturing an IC device, by which a metal-containing film of good quality may be formed using a metal-containing source compound capable of providing excellent process stability and mass productivity to provide desired electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organometallic compound represented by Formula (I),

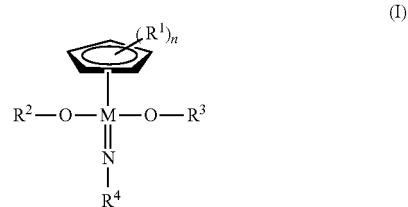

wherein, in Formula (I), M is a tantalum atom; or a vanadium atom, $R^1$ is a C1-C5 straight-chain alkyl group or a C3-C5 branched alkyl group, $R^2$ and $R^3$ are each independently a C1-C8 straight-chain alkyl group or a C3-C8 branched alkyl group, at least one of $R^2$ and $R^3$ being substituted with at least six fluorine atom, $R^4$ is a C1-C10 straight-chain alkyl group or a C3-C10 branched alkyl group, and n is an integer of 0 to 5, and wherein the organometallic compound is a liquid at a temperature of about 20° C. at an atmospheric pressure.

2. The organometallic compound as claimed in claim 1, wherein, in Formula (I),
n is 0 or 1, and
when n is 1, $R^1$ is a methyl group or an ethyl group.

3. The organometallic compound as claimed in claim 1, wherein, in Formula (I), $R^2$ and $R^3$ are each independently a C1-C8 straight-chain perfluoroalkyl group or a C3-C5 branched perfluoroalkyl group.

4. The organometallic compound as claimed in claim 1, wherein, in Formula (I), at least one of $R^2$ and $R^3$ is a C3-C5 branched perfluoroalkyl group.

5. An organometallic compound represented by Formula (I),

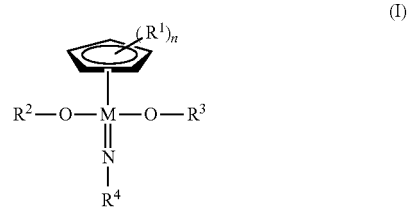

wherein, in Formula (I), M is a niobium atom,
n is 0,
$R^2$ and $R^3$ are each independently a hexafluoroisopropyl group or a nonafluoro tert-butyl group, and
$R^4$ is a C1-C10 straight-chain alkyl group or a C3-C10 branched alkyl group, and wherein the organometallic compound is a liquid at a temperature of about 20° C. at an atmospheric pressure.

6. The organometallic compound as claimed in claim 1, wherein, in Formula (I), $R^4$ is a C3-C8 branched alkyl group.

7. The organometallic compound as claimed in claim 1, wherein, in Formula (I), $R^4$ is an isopropyl group, a sec-butyl group, a tert-butyl group, a tert-pentyl group, or a tert-octyl group.

8. The organometallic compound as claimed in claim 1, wherein, in Formula (I), M is a tantalum atom.

9. The organometallic compound as claimed in claim 1, wherein, in Formula (I), M is a tantalum atom, $R^1$ is a methyl group or an ethyl group, $R^2$ and $R^3$ are each independently a C1-C8 straight-chain perfluoroalkyl group or a C3-C5 branched perfluoroalkyl group, $R^4$ is a C3-C8 branched alkyl group, and n is 0 or 1.

10. A method of manufacturing an integrated circuit (IC) device, the method comprising forming a metal-containing film on a substrate by using an organometallic compound represented by Formula (I):

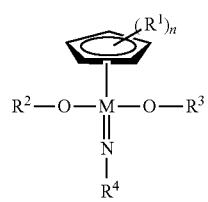
(I)

wherein, in Formula (I), M is a niobium atom, n is 0, $R^2$ and $R^3$ are each independently a hexafluoroisopropyl group or a nonafluoro tert-butyl group, and $R^4$ is a C1-C10 straight-chain alkyl group or a C3-C10 branched alkyl group, and wherein the organometallic compound is a liquid at a temperature of about 20° C. at an atmospheric pressure.

11. The method as claimed in claim 10,
wherein forming the metal-containing film includes:
supplying the organometallic compound of Formula (I) onto the substrate; and
supplying a reactive gas onto the substrate.

12. The method as claimed in claim 11,
wherein the reactive gas includes a nitriding gas, the nitriding gas including $NH_3$, $N_2$ plasma, an organic amine compound, a hydrazine compound, or a combination thereof.

13. The method as claimed in claim 11,
wherein the reactive gas includes an oxidizing gas, the oxidizing gas including $O_2$, $O_3$, $O_2$ plasma, $H_2O$, $NO_2$, NO, nitrous oxide ($N_2O$), CO, $CO_2$, $H_2O_2$, HCOOH, $CH_3COOH$, $(CH_3CO)_2O$, an alcohol, a peroxide, sulfur oxide, or a combination thereof.

14. The organometallic compound as claimed in claim 5, wherein, in Formula (I), $R^4$ is a C3-C8 branched alkyl group.

15. The organometallic compound as claimed in claim 5, wherein, in Formula (I), $R^4$ is an isopropyl group, a sec-butyl group, a tert-butyl group, a tert-pentyl group, or a tert-octyl group.

16. The method as claimed in claim 10, wherein, in Formula (I), $R^4$ is a C3-C8 branched alkyl group.

17. The method as claimed in claim 10, wherein, in Formula (I), $R^4$ is an isopropyl group, a sec-butyl group, a tert-butyl group, a tert-pentyl group, or a tert-octyl group.

* * * * *